(12) United States Patent
Nakagawa et al.

(10) Patent No.: US 7,968,463 B2
(45) Date of Patent: Jun. 28, 2011

(54) FORMATION METHOD OF METALLIC COMPOUND LAYER, MANUFACTURING METHOD OF SEMICONDUCTOR DEVICE, AND FORMATION APPARATUS FOR METALLIC COMPOUND LAYER

(75) Inventors: Takashi Nakagawa, Tokyo (JP); Toru Tatsumi, Tokyo (JP); Makiko Oshida, Tokyo (JP); Nobuyuki Ikarashi, Tokyo (JP); Kensuke Takahashi, Tokyo (JP); Kenzo Manabe, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 121 days.

(21) Appl. No.: 12/227,714

(22) PCT Filed: May 21, 2007

(86) PCT No.: PCT/JP2007/060745
§ 371 (c)(1),
(2), (4) Date: Nov. 25, 2008

(87) PCT Pub. No.: WO2007/139041
PCT Pub. Date: Dec. 6, 2007

(65) Prior Publication Data
US 2009/0170252 A1 Jul. 2, 2009

(30) Foreign Application Priority Data
May 25, 2006 (JP) .................................. 2006-145519

(51) Int. Cl.
*H01L 21/44* (2006.01)
(52) U.S. Cl. ................................. 438/682; 257/E21.165
(58) Field of Classification Search .................. 438/682; 257/E21.151, 165
See application file for complete search history.

(56) References Cited

U.S. PATENT DOCUMENTS

| 4,684,542 | A | * | 8/1987 | Jasinski et al. ................ 438/680 |
| 4,756,927 | A | * | 7/1988 | Black et al. .................... 427/586 |
| 5,459,099 | A |   | 10/1995 | Hsu |
| 6,004,872 | A |   | 12/1999 | Tezuka et al. |
| 6,291,346 | B1 |  | 9/2001 | Tai |

(Continued)

FOREIGN PATENT DOCUMENTS

JP 5-144747 6/1993

(Continued)

OTHER PUBLICATIONS

Hsu et al. 'Selective area platinum silicide film deposition using a molecular precursor chemical beam source': Thin Solid Films vol. 269 (1995), p. 21-28, full text, Fig.1-8.

(Continued)

*Primary Examiner* — W. David Coleman
(74) *Attorney, Agent, or Firm* — McGinn IP Law Group, PLLC

(57) ABSTRACT

A formation method of a metallic compound layer includes preparing, in a chamber, a substrate having a surface on which a semiconductor material of silicon, germanium, or silicon germanium is exposed, and forming a metallic compound layer, includes: supplying a raw material gas containing a metal for forming a metallic compound with the semiconductor material to the chamber; heating the substrate to a temperature at which the raw material gas is pyrolyzed; and forming a metallic compound layer by reaction of the metal with the semiconductor material so that no layer of the metal is deposited on the substrate. A manufacturing method of a semiconductor device employs this formation method of a metallic compound layer.

31 Claims, 16 Drawing Sheets

U.S. PATENT DOCUMENTS

| | | |
|---|---|---|
| 7,226,827 B2 | 6/2007 | Schram et al. |
| 2005/0059243 A1 | 3/2005 | Schram et al. |
| 2005/0145943 A1 | 7/2005 | Schram et al. |
| 2006/0030161 A1 | 2/2006 | Machida et al. |
| 2007/0215951 A1 | 9/2007 | Schram et al. |

FOREIGN PATENT DOCUMENTS

| | | |
|---|---|---|
| JP | 6-318563 | 11/1994 |
| JP | 7-297136 | 11/1995 |
| JP | 8-97249 | 4/1996 |
| JP | 8-139030 | 5/1996 |
| JP | 8-283944 | 10/1996 |
| JP | 10-144625 | 5/1998 |
| JP | 2000-58484 | 2/2000 |
| JP | 2000-133617 | 5/2000 |
| JP | 2003-328130 | 11/2003 |
| JP | 2005-93732 | 4/2005 |
| JP | 2005-123625 | 5/2005 |
| JP | 2006-45649 | 2/2006 |
| JP | 2006-179874 | 7/2006 |

OTHER PUBLICATIONS

Ishikawa et al. 'Ni Precursor for Chemical Vapor Deposition of NiSi': Jpn. J. Appl. Phys., vol. 43, No. 4B(2004), p. 1833-1836, full text, Fig.1-8.

Ann Lauwers, et al. "Materials aspects, electrical performance, and scalability of Ni silicide towards sub-0.13 um technologies", J. Vac. Sci. Technol. B 19(6), Nov./Dec. 2001, pp. 2026-2037.

A. Vantomme, et al., "Concentration-controlled phase selection of silicide formation, during reactive deposition", Applied Physics Letters, vol. 74, No. 21, May 22, 1999, pp. 3137-3139.

D. Hesse, et al. "Electron Microscopy Evidence of Interfacial Steps Controlling the Kinetics of NiSi2 Formation", Mat. Res. Soc. Symp. Proc., vol. 320., 1994, pp. 221-226.

Masato Ishikawa, et al., "Composition control of Ni-silicide by CVD using Ni(PF3)4 and Si3Hs", International Conference On Solid State Devices and Materials, Kobe, 2005, pp. 508-509.

Seiji Motojima, et al., Preparation and Properties of Nickel Silicide Layers by the Diffusion and CVD Processes Using $Si_2Cl_6$ as a Source of Silicon, Journal of Materials Science 22 (1987) 547-553.

* cited by examiner (PRESENT INVENTION)

(PRESENT INVENTION)

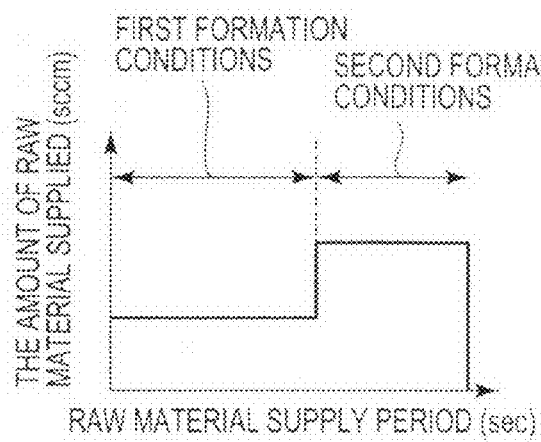 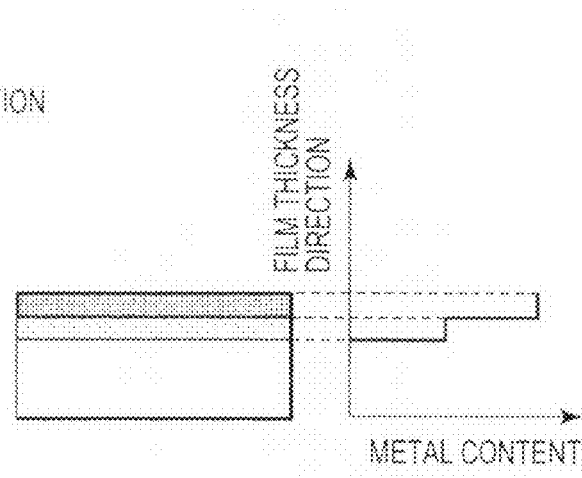
FIG. 8A  FIG. 8B
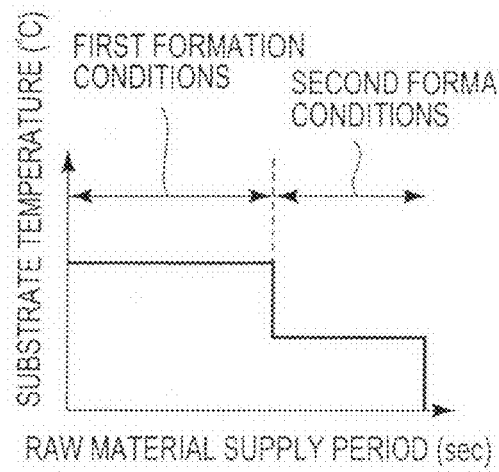 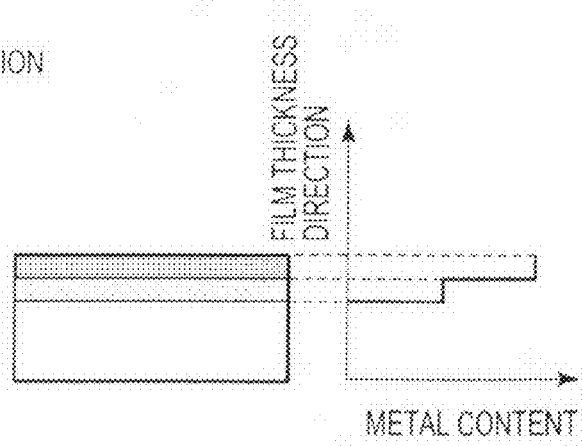
FIG. 9A  FIG. 9B

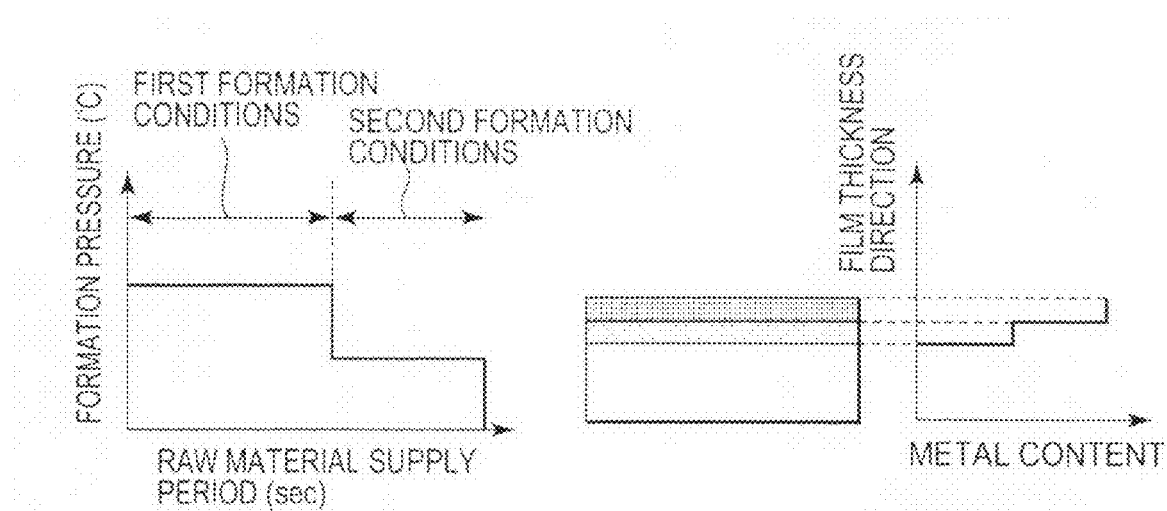
FIG. 10A      FIG. 10B
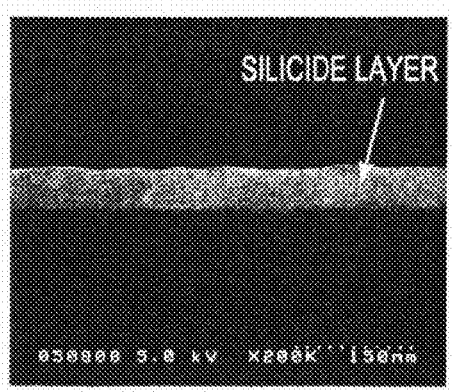   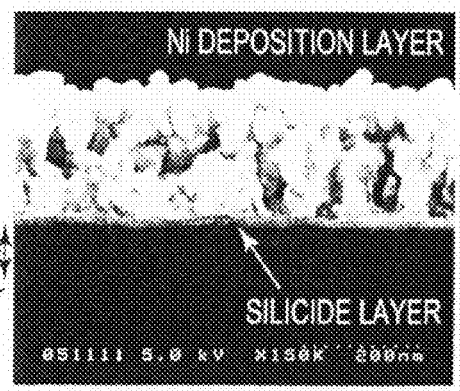
FIG. 11A      FIG. 11B

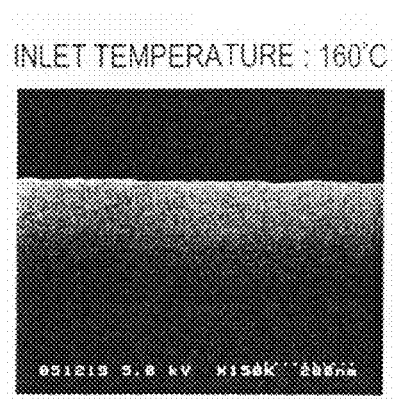
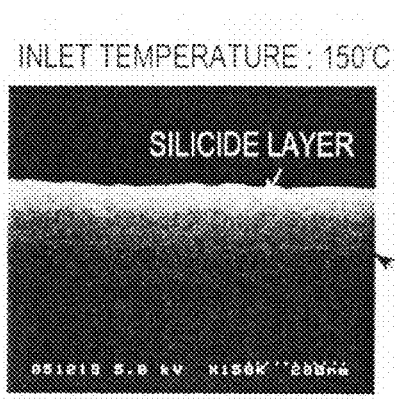
FIG. 18A    FIG. 18B
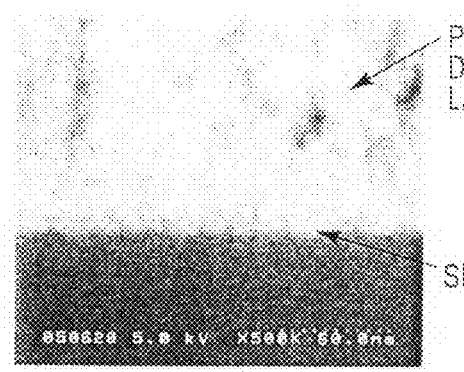
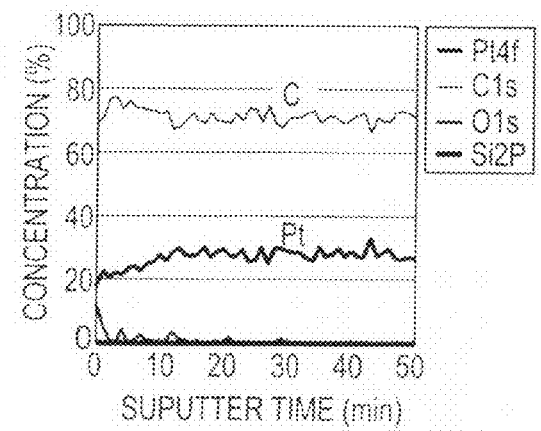
FIG. 19A    FIG. 19B

FORMATION METHOD OF METALLIC COMPOUND LAYER, MANUFACTURING METHOD OF SEMICONDUCTOR DEVICE, AND FORMATION APPARATUS FOR METALLIC COMPOUND LAYER

TECHNICAL FIELD

The present invention relates to technology for a formation method and a formation apparatus of a metallic compound layer used in a semiconductor device such as an integrated circuit, and for a manufacturing method of a semiconductor device. More particularly, the present invention relates to technology for a formation method and a formation apparatus of a metallic compound layer used in a gate electrode.

BACKGROUND ART

In the development of advanced CMOS (complementary MOS) devices in which transistors have been miniaturized, a sheet resistance of a diffusion layer or a gate electrode in a source region or a drain region should be reduced in order to improve characteristics of transistors. For the purpose of reduction in sheet resistance, a salicide technique has been employed which includes bonding metal after deposition of a gate electrode material and after formation of a source/drain region, performing an annealing process to silicidate only metal attached to the gate electrode material and the source/drain region, and then removing metal that has not reacted by selectively etching.

Furthermore, deterioration of a driving current due to depletion in a gate electrode of polysilicon (poly-Si) has been a recent issue. Attempt to avoid depletion in a gate electrode has been made by applying a metal gate electrode. Pure metals, metallic compounds such as metal nitrides, silicide materials, germanium compounds, or the like have been considered as materials used for the metal gate electrode. In any case, an N-type MOSFET or a P-type MOSFET should have a threshold voltage ($V_{th}$) which can be set at a proper value.

In order to achieve Vth of ±0.5 V or less in a CMOS transistor, a gate electrode in an N-type MOSFET should use a material having a work function not more than a midgap of Si (4.6 eV), preferably not more than 4.4 eV, and a gate electrode in a P-type MOSFET should use a material having a work function not less than a midgap of Si (4.6 eV), preferably not less than 4.8 eV. Thus, technology to form a metallic compound layer having an optimum resistance or work function has been demanded for a source/drain region, a gate electrode for an N-type MOSFET, and a gate electrode for a P-type MOSFET. Furthermore, increase in fineness and complexity of element structures has required a method of forming a metallic compound layer uniformly on a large area with excellent covering capability.

Examination has heretofore been made of a method of forming a silicide layer among other metallic compound layers. In the technology disclosed in J. Vac. Sci. Technol. B19 (6), November/December 2001 L2026 (hereinafter referred to as Non-patent Document), a Ni layer is formed on a poly-silicon gate pattern by a sputtering method, and then annealing treatment is performed so that the Ni layer reacts with polysilicon to form a silicide layer. In the case, the composition of the silicide can be controlled by an annealing temperature. It is disclosed that $Ni_2Si$ can be formed by an annealing process in a range of 300° C. to 350° C., that NiSi can be formed by an annealing process in a range of 350° C. to 650° C., and that $NiSi_2$ can be formed by an annealing process of 650° C. or more. The formation method has features in that a metal film is deposited in a region on which a silicide layer is to be formed and that desired characteristics of a silicide composition are obtained by the temperature of subsequent annealing.

Furthermore, Appl. Phys. Lett., Vol. 74, No. 21, 24 May 1999, p. 3137 (hereinafter referred to as Non-patent Document 2) and Mater. Res. Soc. Symp. Proc. 320, 1994, p. 221 (hereinafter referred to as Non-patent Document 3) disclose supplying Ni, Co, or Fe onto a silicon substrate at a low rate (low supply rate) by using MBE or a vapor deposition method to form $NiSi_2$, $CoSi_2$, or $FeSi_2$ directly on the silicon substrate. Use of a formation method disclosed by those documents has advantages in that a silicide layer having a Si-rich composition can be formed at a temperature lower than that in the method described by Non-patent Document 1.

Moreover, Japanese laid-open patent publication No. 10-144625 (hereinafter referred to as Patent Document 1) discloses a method of applying titanium onto a silicon substrate by a chemical vapor deposition method (CVD) using high-frequency plasma to form a titanium silicide ($TiSi_2$) layer having C54 structure. The features of the technology have advantages in that an annealing process can be omitted because a silicide layer can be formed directly as with Non-patent Document 2.

Furthermore, Japanese laid-open patent publication No. 8-97249 (hereinafter referred to as Patent Document 2) and Japanese laid-open patent publication No. 7-297136 (hereinafter referred to as Patent Document 3) disclose a method of introducing a titanium tetrachloride gas and a hydrogen gas onto a silicon substrate and forming a titanium silicide ($TiSi_2$) layer having C54 structure by a CVD method using plasma excitation with electron cyclotron resonance, helicon wave, or ECR. The features of this technology have advantages in that an annealing process can be omitted because a silicide layer can be formed directly in a similar manner being described in Patent Document 1.

Moreover, Japanese laid-open patent publication No. 2000-58484 (hereinafter referred to as Patent Document 4) discloses a method of forming a titanium silicide layer on a silicon substrate by a plasma CVD method using (1) titanium tetrachloride and a hydrogen gas or (2) titanium tetrachloride, a silane gas, and a hydrogen gas. Furthermore, Japanese laid-open patent publication No. 8-283944 (hereinafter referred to as Patent Document 5) discloses a method which includes using titanium tetrachloride and a silane gas as a raw material gas, adding hydrogen fluoride to the raw material gas, and forming a titanium silicide film ($TiSi_2$) on a silicon substrate by a CVD method.

Furthermore, Japanese laid-open patent publication No. 2003-328130 (hereinafter referred to as Patent Document 6), Japanese laid-open patent publication No. 2005-93732 (hereinafter referred to as Patent Document 7), and Non-patent Document 3 describe a method of forming a nickel silicide film on a silicon substrate by a CVD method by the use of a material containing Ni and a material containing Si.

Furthermore, Extended Abstracts of International Conference on Solid State Devices and Materials 2005, p. 508 (hereinafter referred to as Non-patent Document 4) describes that a nickel silicide film is formed by a CVD method using $Ni(PF_3)_4$ as a raw material gas containing Ni and $Si_3H_8$ as a raw material gas containing Si and that the composition of the nickel silicide film can be changed by the amount of $Si_3H_8$ supplied.

Moreover, U.S. Pat. No. 5,459,099 (hereinafter referred to as Patent Document 8) discloses deposition of Pt by a CVD method using $Pt(PF_3)_4$ as a metal material gas, and also describes that a Pt film is formed by supplying a raw material of Pt(PF$_3$)$_4$ onto a silicon substrate heated to 300° C. or less and that a deposition rate of Pt is increased at temperatures higher than 300° C. while a platinum silicide is simultaneously formed.

DISCLOSURE OF INVENTION

Problem(s) to be Solved by the Invention

However, the formation technology of a metallic compound layer represented by the aforementioned silicide layer has the following problems.

First, in the technique to deposit Ni by a sputtering method and control a Ni/Si composition ratio of a nickel silicide by conditions of subsequent annealing, a problem is present in that an annealing process is needed and that the manufacturing cost is thus increased. Furthermore, since a metal for forming a silicide is deposited by a sputtering method, elements may be subjected to plasma damage, so that element characteristics may be impaired.

Furthermore, in a case where NiSi$_2$ is used as a material for a gate electrode, for example, an annealing step under at least 650° C. is required. Therefore, during the annealing step, a silicide layer provided in a source/drain region may be increased in resistance, or Ni contained in the gate electrode may diffuse into a gate insulation film. Thus, element characteristics may be impaired in some cases. Additionally, it may be difficult to form a silicide layer on a three-dimensional structure or a trench structure having a high aspect ratio in view of covering capability, wrapping capability, and embedding capability of deposition.

The gate electrode of Non-patent Document 1 has a mixed phase of NiSi$_2$ and NiSi. Use of a gate electrode having such a mixed phase may cause variation in element characteristics. Furthermore, Non-patent Document 1 describes that an annealing temperature for obtaining a NiSi crystal phase varies depending upon the types and concentration of impurities in a substrate when a silicide layer is formed at a low temperature of 400° C. or less. Accordingly, with the formation method of the silicide layer in this document, an annealing temperature should be optimized depending upon the types and concentration of impurities in a substrate. Therefore, the number of processes required is problematically increased.

Second, with a method of forming a silicide layer having a Si-rich composition by using an MBE method or a vapor deposition method and supplying a metal at a low rate as disclosed in Non-patent Document 2 and Non-patent Document 3, it is difficult to form a uniform silicide layer on a large area. Furthermore, it is difficult to form a silicide layer on a three-dimensional structure or a trench structure having a high aspect ratio in view of covering capability, wrapping capability, and embedding capability of deposition. Moreover, those documents are silent on a method of changing a silicide composition in a wide range and are not suitable to form a silicide layer having a composition optimum for each portion of a semiconductor device, such as a source region, a drain region, a gate electrode for an N-type MOSFET, and a gate electrode for a P-type MOSFET.

Third, with the method of forming a silicide layer by using plasma CVD, which is disclosed by Patent Documents 1, 2, 3, and 4, element characteristics may be impaired by plasma damage to elements during formation of a silicide layer. Furthermore, in a gas phase formation method with plasma excitation, elements unnecessary for formation of a silicide layer may be decomposed by plasma excitation and adsorbed on a surface of a substrate. Such unnecessary elements may serve as impurities on the surface of the substrate, thereby inhibiting the formation of the silicide layer.

Accordingly, while a silicide layer (TiSi$_2$) having a Si-rich composition can be formed, it may be difficult to form a silicide layer having a metal-rich composition. Furthermore, chlorine radials generated by plasma excitation react with Si on the substrate, resulting in problematically etching the substrate. In Patent Document 3, the flow rate of TiCl$_4$ is controlled in order to suppress influence from those chlorine radials. However, a completely flat silicide layer has not been formed. Moreover, with the method of forming a silicide layer with use of TiCl$_4$ and a silane gas as disclosed by Patent Document 3, while influence from the aforementioned etching can be suppressed, a silicide layer is deposited in regions other than a source/drain region or a gate electrode, e.g., an insulation film, such as a gate sidewall. It is difficult to selectively remove the silicide layer on the gate sidewall during a subsequent etching process.

Fourth, in formation of a silicide film with a CVD method using a raw material gas containing a metal and a raw material gas containing Si as disclosed by Patent Documents 5, 6, and 7 and Non-patent Document 4, a silicide layer is deposited in regions other than a source/drain region or a gate electrode, e.g., an insulation film, such as a gate sidewall. It is difficult to selectively remove the silicide layer on the gate sidewall during a subsequent etching process.

Fifth, with the formation method of a silicide film as described by Patent Document 8, a metal layer and a silicide layer are simultaneously formed on a silicon substrate. Therefore, it is difficult to control the composition of a silicide layer. In this case, as with Non-patent Document 1, the composition of a silicide layer needs to be controlled by the temperature of annealing after the formation of a metal layer. Thus, reduction of the number of processes cannot be expected. Furthermore, Patent Document 8 is silent on a structure of the composition or crystal phase in a formed silicide layer, a control method of the composition or crystal phase in a formed silicide layer, and effects of reduction in temperature of silicidation. Thus, Patent Document 8 is not suitable to form a silicide layer having a composition optimum for each of a source/drain region, a gate electrode for an N-type MOSFET, and a gate electrode for a P-type MOSFET.

As described above, the conventional manufacturing methods are not suitable to form a silicide layer having a composition optimum for each of a source/drain region, a gate electrode for an N-type MOSFET, and a gate electrode for a P-type MOSFET.

It is, therefore, an object of the present invention to solve the aforementioned problems in the prior art. An object of the present invention is to provide a method, a formation apparatus, and a manufacturing method of a semiconductor device which can form a metallic compound layer directly on a substrate and can control a composition or crystal phase of the metallic compound layer without adding a process, such as annealing.

Means to Solve the Problems

In order to achieve the above object, the present invention includes the following structures.

According to an aspect of the present invention, there is provided a method of forming a metallic compound layer, which comprises:

preparing, in a chamber, a substrate having a surface on which a semiconductor material including one of silicon, germanium, and silicon germanium is exposed; and forming a metallic compound layer including:

supplying a raw material gas containing a metal for forming a metallic compound with the semiconductor material exposed on the surface of the substrate to the chamber;

heating the substrate to a temperature at which the raw material gas is pyrolyzed; and forming the metallic compound layer by reaction of the metal with the semiconductor material under a condition in which no layer of the metal is deposited on the substrate.

Furthermore, according to another aspect of the present invention, there is provided a method of manufacturing a semiconductor device, which comprises:

preparing a substrate having a surface on which a semiconductor material including one of silicon, germanium, and silicon germanium is exposed;

forming a gate insulation film and a gate pattern on the substrate;

forming a source/drain region on both sides of the gate pattern to sandwich the gate pattern;

forming a metallic compound layer on the source/drain region by reaction of the first metal with the semiconductor material so that no layer of the first metal is deposited on the substrate by supplying a first raw material gas containing a first metal for forming a metallic compound with silicon, germanium, or silicon germanium, and thereafter by heating the substrate to a temperature at which the first raw material gas is pyrolyzed and forming a gate electrode for forming the gate pattern into a gate electrode.

Moreover, according to another aspect of the present invention, there is provided an apparatus for forming a metallic compound layer, comprising:

a chamber;

a substrate holder provided in the chamber to hold a substrate;

a first heater for increasing a temperature of the substrate holder;

a raw material gas supply portion connected to the chamber through a raw material gas inlet to supply a raw material gas;

a second heater operable to increase a temperature of the raw material gas inlet;

a conductance valve for adjusting a pressure in the chamber; and a controller for adjusting a temperature of the substrate holder, a temperature of the raw material gas inlet, an amount of the raw material gas supplied, and a pressure in the chamber to prevent a layer of a metal contained in the raw material gas from being deposited on the substrate held in the chamber.

BRIEF DESCRIPTION OF DRAWINGS

FIG. 8A is a diagram showing formation conditions for a first and second silicide layer.

FIG. 8B is a diagram showing a first and second silicide layer formed under the formation conditions shown in FIG. 8A.

FIG. 9A is a diagram showing formation conditions for a first and second silicide layer.

FIG. 9B is a diagram showing a first and second silicide layer formed under the formation conditions shown in FIG. 9A.

FIG. 10A is a diagram showing formation conditions for a first and second silicide layer.

FIG. 10B is a diagram showing a first and second silicide layer formed under the formation conditions shown in FIG. 10A.

FIG. 11A is a diagram showing a cross-sectional photograph of a silicide layer in Example 1 of the present invention, which was taken by SEM.

FIG. 11B is a diagram showing a cross-sectional photograph of a silicide layer in Comparative Example 1, which was taken by SEM.

FIG. 18A is a diagram showing a cross-sectional photograph of a silicide layer in Reference Example 3, which was taken by SEM.

FIG. 18B is a diagram showing a cross-sectional photograph of a silicide layer in Example 14 of the present invention, which was taken by SEM.

FIG. 19A is a diagram showing a cross-sectional photograph of a silicide layer manufactured in Reference Example 5, which was taken by SEM.

FIG. 19B is a diagram showing a composition analysis result by XPS for the silicide layer manufactured in Reference Example 5.

BEST MODE FOR CARRYING OUT THE INVENTION

Embodiments of the present invention will be described in detail with reference to the drawings.

The present invention relates to a formation method of a metallic compound layer (a silicon metallic compound layer, a germanium metallic compound layer, or a silicon germanium metallic compound layer), a formation apparatus of a metallic compound layer, and a manufacturing method of a semiconductor device. For example, such a metallic compound layer includes a silicide layer provided on a source/drain region, which is needed to improve the high performance of a MOSFET, a gate electrode, or the like.

In this formation method of a metallic compound layer, a raw material gas containing at least one type of metal capable of forming a metallic compound layer is first supplied to a substrate on which silicon, germanium, or silicon germanium is exposed and which has been heated to a temperature at which the raw material gas can be pyrolyzed. At that time, the amount of the raw material gas supplied is set to be not more than the amount (supply rate) at which the metal begins to be deposited on the substrate, so that the exposed portion of the substrate can selectively be silicidated by pyrolysis reaction.

In other words, in a formation method of a metallic compound layer according to the present invention, the amount of the raw material gas supplied is set so as to meet the following relationship:

(The amount of the metal material gas supplied)<(The adsorption rate of metal atoms pyrolyzed on a surface of a substrate so as to cause deposition of a metal film on the surface of the substrate)

Thus, metal atoms adsorbed on the substrate are all consumed for formation of a metallic compound layer, and no metallic layer is deposited on the substrate.

In this manner, according to the present invention, a metallic compound layer can be formed by a one-stage process. Therefore, it is possible to control the composition of a silicide layer and to reduce a formation temperature of a silicide layer by controlling the formation conditions (the amount of a raw material gas supplied, the temperature of a substrate, the pressure in a vacuum chamber, and the like).

(Formation Apparatus for Metallic Compound Layer)

Figure 1:
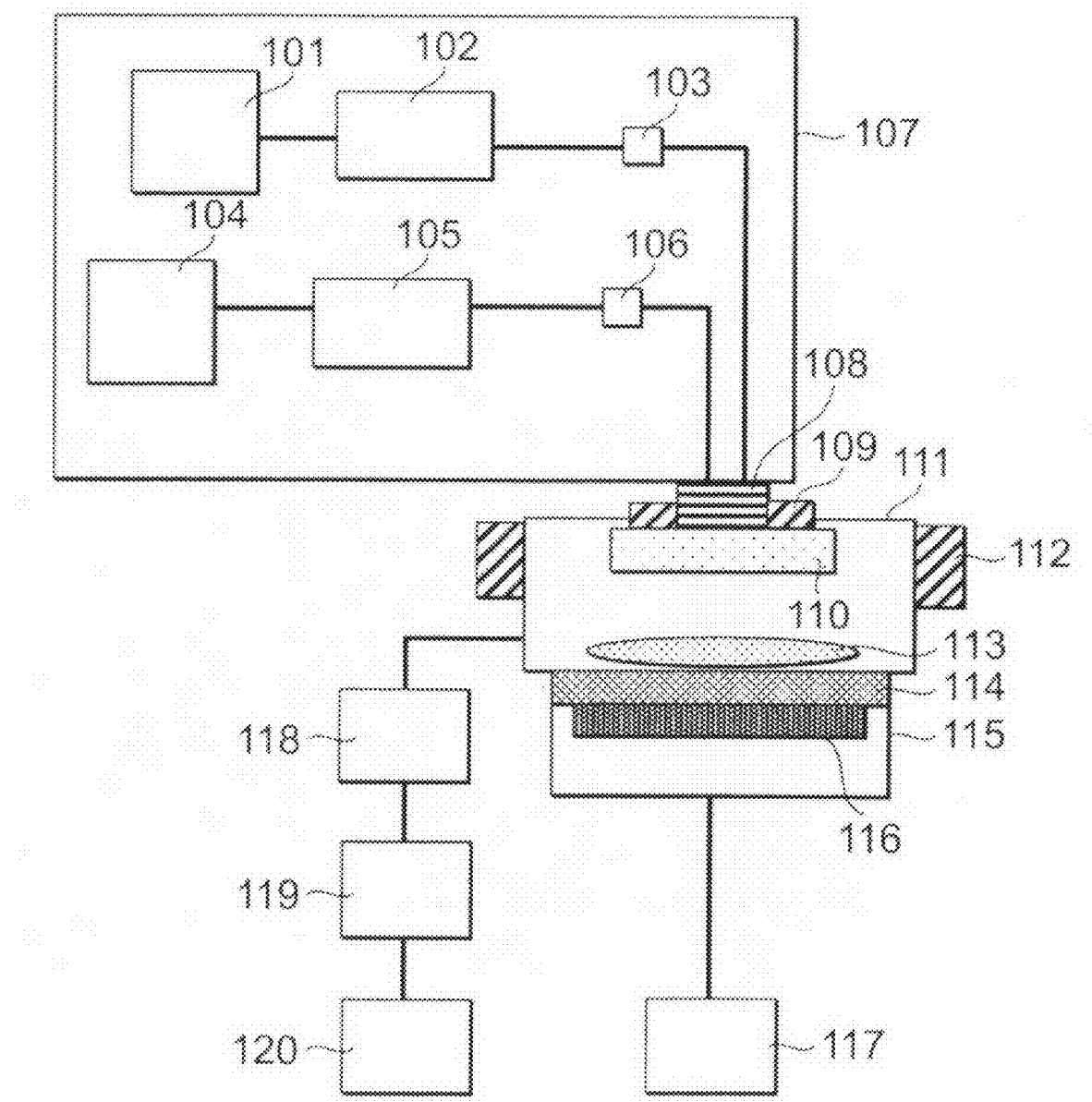
FIG. 1 is a diagram showing an example of a formation apparatus according to the present invention.

FIG. 1 shows an example of a deposition apparatus used in an embodiment of the present invention. In this apparatus, a raw material gas including a metal capable of forming a metallic compound layer is first supplied from a raw material gas source 101, adjusted at a predetermined flow rate by a mass-flow controller 102, and then supplied through a valve 103, a gas inlet 108, and a showerhead 110 into a vacuum chamber (chamber) 111.

A carrier gas is supplied from a carrier gas source 104, adjusted at a predetermined flow rate by a mass-flow controller 105, and supplied through a valve 106, the gas inlet 108, and the showerhead 110 into the vacuum chamber (chamber) 111.

The raw material gas may be supplied alone or in combination with the carrier gas into the vacuum chamber 111. The carrier gas may be used as a replacement gas when the raw material gas is not supplied into the vacuum chamber 111. It is preferable that an inert gas, which does not react with the raw material gas, be used as the carrier gas, and that the carrier gas include at least one type of gas selected from the group consisting of $N_2$, Ar, and He.

In this apparatus, the carrier gas source 104, the mass-flow controller 105, and the valve 106 are controlled at the same temperature as the metal material gas by a thermostatic chamber 107 as a temperature control device such that the carrier gas does not affect the temperature of the raw material gas when the carrier gas joins the raw material gas. The temperature of the thermostatic chamber 107 is preferably controlled in a range of 0° C. to 150° C.

The raw material inlet 108, the showerhead 110, and the vacuum chamber 111 are controlled in temperature by a heater 109 and a heater 112 as a temperature control device so as to have a temperature not less than a temperature at which the raw material gas 101 has a sufficient vapor pressure and not more than a decomposition temperature of the raw material gas. It is preferable that this controlled temperature be in a range of 0° C. to 150° C.

A substrate 113 is provided in the vacuum chamber 111 and heated to a predetermined temperature (a temperature at which the raw material gas can be pyrolyzed on a surface of the substrate) via a susceptor 114 as a substrate support by a heater 116 as a heating device. Furthermore, the susceptor 114 prevents the raw material gas from being introduced to around the heater 116.

The raw material gas that has been supplied into the vacuum chamber 111 but has not been consumed for formation of a metallic compound layer and the carrier gas are discharged through a conductance valve 118 by a discharge pump 120. Furthermore, the pressure in the vacuum chamber 111 is controlled by an opening of the conductance valve 118. A reference numeral of "119" denotes a trap.

In this formation apparatus for a metallic compound layer, the thermostatic chamber 107, the mass-flow controllers 102 and 105, the heaters 109, 112, and 116, and the conductance valve 118 are connected to a controller (not shown) and respectively controlled by the controller under conditions that do not cause deposition of a metal layer on the substrate.

More specifically, conditions that do not cause deposition of a metal layer are inputted in advance as characteristic values for the aforementioned devices to the controller. When characteristic values of the respective portions deviate from the values inputted in advance during the operation of the apparatus, then the controller commands the respective portions to adjust the characteristic values into the value inputted in advance. The characteristic values of the respective portions are maintained at predetermined values by this command.

Furthermore, the characteristic values of the respective portions can be changed a plurality of times during the operation of the apparatus. In this case, when the controller is configured in advance so as to change formation conditions for a metallic compound layer during the operation of the apparatus, then the controller commands the respective portions to change their formation conditions during the formation of the metallic compound layer. By changing formation conditions for a metallic compound layer during the operation of the apparatus, it is possible to form metallic compound layers having a plurality of compositions or different characteristics.

(Formation Mechanism of the Metallic Compound Layer)

Figure 2A:
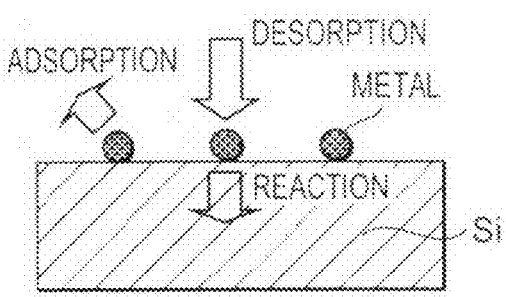
FIG. 2A is a diagram showing a reaction process on a surface of a substrate according to the present invention.
Figure 2C:
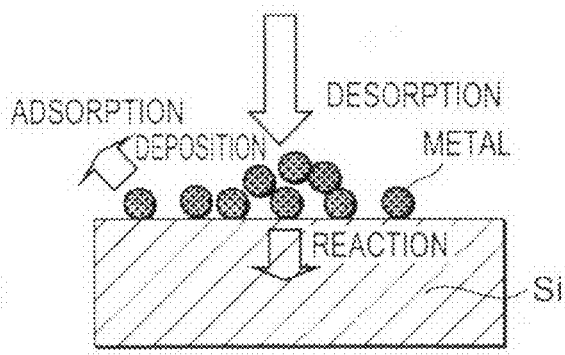
FIG. 2C is a diagram showing a reaction process on a surface of a substrate in the prior art.
Figure 2B:
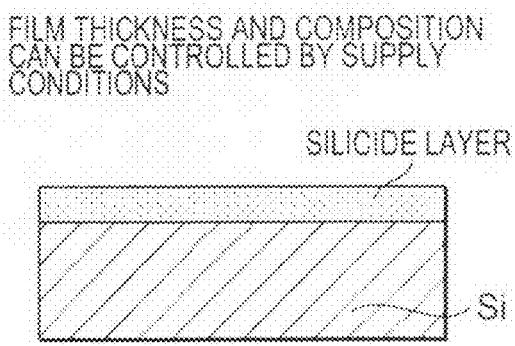
FIG. 2B is a diagram showing a reaction process on the surface of the substrate according to the present invention.
Figure 2D:
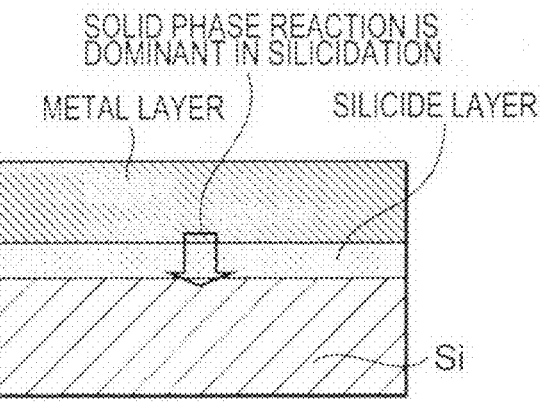
FIG. 2D is a diagram showing a reaction process on the surface of the substrate in the prior art.

A formation mechanism of a metallic compound layer according to the present invention will be described. FIGS. 2A to 2D show cases in which a metallic element is Ni and the formation apparatus shown in FIG. 1 is used to supply a raw material gas containing Ni to a silicon substrate and to form a silicon metallic compound layer (silicide layer) as a metallic compound layer. FIGS. 2A and 2B show a formation mechanism of a silicide layer according to the present invention, and FIGS. 2C and 2D show a conventional formation mechanism of a silicide layer.

As shown in FIG. 2A, the raw material gas is decomposed in a gas phase or on a surface of the substrate by thermal excitation from the substrate. Thus, Ni atoms are adsorbed on the surface of the substrate. In other words, adsorption and desorption are continuously carried out on the surface of the substrate. As a whole, a predetermined amount of Ni atoms is adsorbed on the surface of the substrate in an equilibrium state. The amount of Ni adsorbed on the surface of the substrate is affected by the amount of the raw material gas supplied, the substrate temperature, and the pressure in the vacuum chamber, and can thus be controlled by those conditions.

For example, if the substrate temperature is high, then molecular motion of the Ni atoms is activated, so that the amount of Ni atoms desorbed from the surface of the substrate is increased. Thus, the amount of Ni atoms adsorbed on the substrate becomes small in an equilibrium state. If the pressure in the vacuum chamber is increased, then the velocity of molecular motion of the Ni atoms is increased so that the amount of Ni atoms desorbed from the surface of the substrate is increased. Thus, the amount of Ni atoms adsorbed on the substrate becomes small in an equilibrium state. Furthermore, if the amount of the raw material gas supplied is increased, then the number of Ni atoms supplied onto the surface of the substrate is increased. Thus, a larger amount of Ni atoms is likely to be adsorbed on the surface of the substrate in an equilibrium state.

Next, as shown in FIG. 2B, Ni adsorbed on the substrate reacts with silicon and diffuses therein to form a silicide layer. At that time, the composition or crystal structure of the silicide layer depends upon the amount of Ni previously adsorbed on the surface of the substrate in the step shown in FIG. 2A. For example, if the amount of Ni adsorbed is small, then $NiSi_2$, which has a Si-rich composition, is formed. Furthermore, as the amount of Ni adsorbed is increased, a silicide layer having a crystal phase of NiSi or $Ni_3Si$, which has a Ni-richer composition, is formed. Accordingly, for example, if formation conditions for a silicide layer are set with a low substrate temperature, a large amount of the raw material gas supplied, and a low pressure of the vacuum chamber, then a silicide layer having a Ni-rich composition can be formed.

Next, FIGS. 2C and 2D show a conventional formation mechanism of a silicide layer, in which the amount of Ni adsorbed on the surface of the substrate is larger than the amount of Ni consumed for silicidation. When the substrate is set at a temperature not less than a temperature at which a metal is decomposed and supplied with Ni, then a certain amount of Ni atoms is adsorbed on the surface of the substrate at a very initial stage. Those Ni atoms react with Si forming the substrate to begin to form a silicide. However, because an excessive amount of Ni more than the amount of Ni required to form a silicide layer in the above manner is supplied sequentially onto the surface of the substrate, a metal that has not reacted is developed and deposited on the substrate, thereby forming a metallic Ni layer.

If such a metallic Ni layer is deposited on the silicon, Ni atoms pyrolyzed and adsorbed on the surface of the substrate do not serve as Ni for silicidation, but a metallic Ni layer deposited on the surface of the substrate serves as Ni for silicidation. Therefore, solid phase reaction becomes dominant in the formation of the silicide layer.

Accordingly, it becomes difficult to control the film thickness and composition of the silicide layer by supply conditions of Ni (the amount of the raw material gas supplied, the pressure in the vacuum chamber, and the like). As a result, in order to control the film thickness and composition of the silicide layer, an annealing process corresponding to the composition or crystal phase needs to be performed after deposition of metal Ni as with the prior art.

In view of the above, in a formation method of a silicide layer according to the present invention, it is important to determine conditions such that the amount of the raw material gas supplied is set to be not more than the amount at which the metal begins to be deposited on exposed regions. By forming a silicide layer under such conditions, it is possible to control the composition or crystal phase of the silicide layer by conditions of supply of the raw material. Furthermore, a silicide layer having a Si-rich composition, which would need an annealing process at a high temperature in the prior art, can be formed at a low temperature.

Figures 3A, 3B:
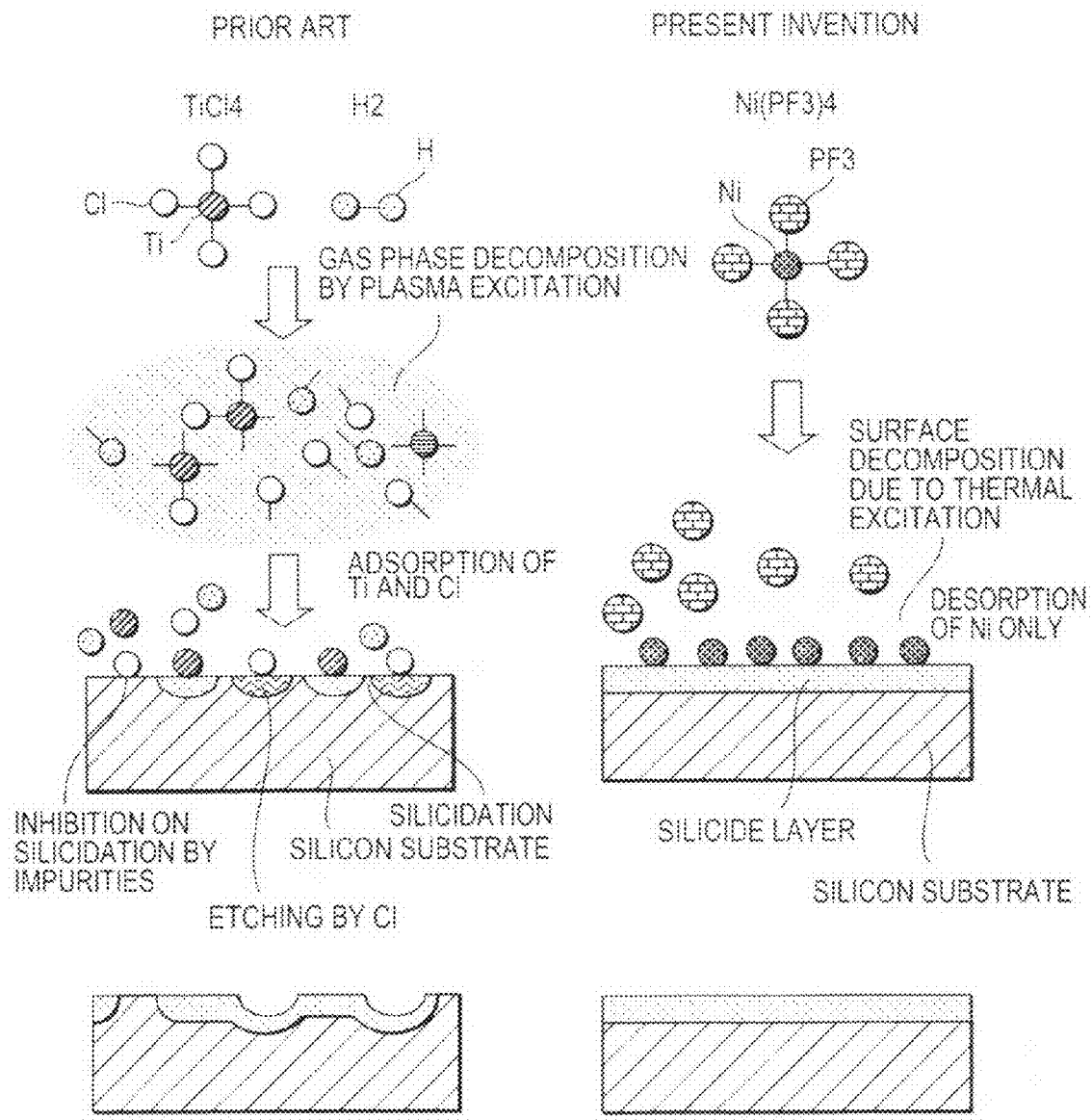
FIG. 3A is a diagram showing a raw material decomposition process at the time of silicidation in the prior art.
FIG. 3B is a diagram showing a raw material decomposition process at the time of silicidation according to the present invention.

Furthermore, when a formation method of a silicide layer according to the prior art disclosed by Patent Documents 1 and 2 is used as shown in FIG. 3A, a raw material gas is decomposed in a gas phase by plasma excitation. Therefore, not only Ti necessary for silicidation, but also Cl decomposed in the gas phase is adsorbed on the surface of the substrate. The adsorbed Cl acts as an impurity on the surface of the substrate and inhibits adsorption of Ti and accordingly silicidation reaction. Thus, a problem arises in that it is difficult to change the composition of the silicide layer. Moreover, Cl decomposed in the gas phase is supplied as chlorine radicals onto the surface of the substrate, thereby etching the silicon substrate. Thus, in a case where a plasma CVD method is used, inhibition on the silicidation and damage to the substrate are caused by influence from elements contained in the raw material. Therefore, an uneven silicide layer is formed as shown in the figure.

Next, a raw material decomposition process according to the present invention is illustrated in FIG. 3B for an example in which $Ni(PF_3)_4$ is used as a raw material gas. According to the present invention, as shown in FIG. 3B, formation of a silicide layer is performed by reaction between Ni produced by pyrolysis of the raw material gas on the surface of the substrate and silicon. Specifically, because only Ni in the $Ni(PF_3)_4$ gas is decomposed on the surface of the substrate, Ni can solely be adsorbed on the surface of the substrate. As a result, impurities that would inhibit the silicidation are not adsorbed on the surface of the substrate. Therefore, the composition of the silicide layer can be changed by the amount of the raw material gas supplied, and a uniform silicide layer can be formed.

Figure 4A:
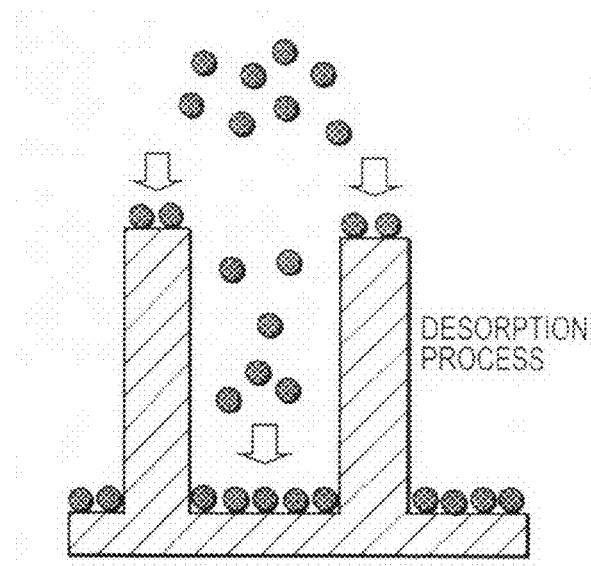
FIG. 4A is a diagram showing a formation state of a silicide layer on a trench structure in the prior art.
Figure 4C:
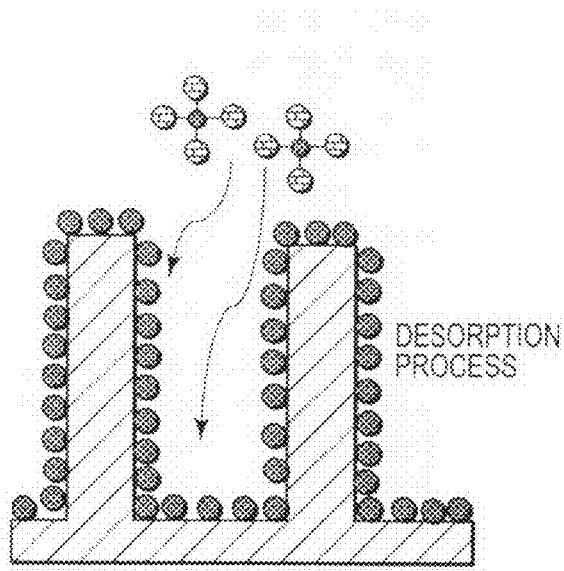
FIG. 4C is a diagram showing a formation state of a silicide layer on a trench structure according to the present invention.
Figure 4B:
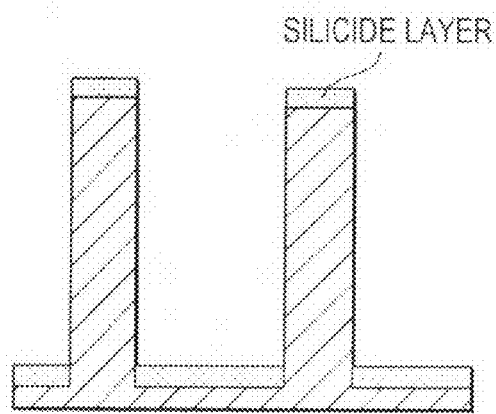
FIG. 4B is a diagram showing a formation state of the silicide layer on the trench structure in the prior art.

Next, FIGS. 4A and 4B are multiple diagrams in a case where a silicide layer is formed on a silicon substrate having an illustrated three-dimensional structure by using a sputtering method of the prior art. In the sputtering method, metal atoms sputtered from a target by plasma reach a substrate in such a state that they have directivity in a direction indicated by the arrows in FIG. 4A. Accordingly, the metal atoms cannot be adsorbed on sidewall portions of the three-dimensional structure as shown in FIG. 4A. Thus, a silicide layer is formed as shown in FIG. 4B.

Figure 4D:
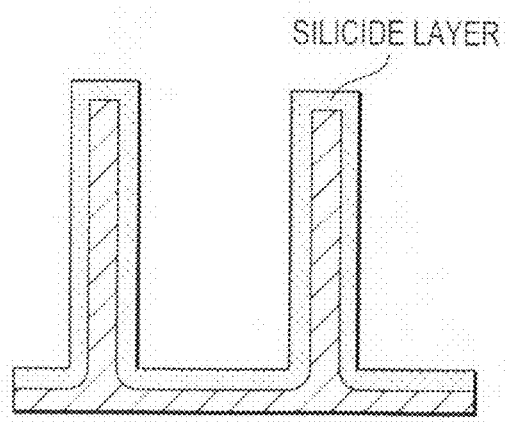
FIG. 4D is a diagram showing a formation state of the silicide layer on the trench structure according to the present invention.

Next, FIGS. 4C and 4D show a case where use is made of a formation method of a silicide layer according to the present invention is used. According to the present invention, the raw material gas does not have energy involved by plasma excitation as compared to the conventional technology. The raw material gas is supplied to a surface of the substrate with low directivity. Accordingly, metal is adsorbed in a state as shown in FIG. 4C. Thus, a silicide layer can be formed with excellent covering capability as shown in FIG. 4D by surface pyrolysis reaction.

As described above, in a formation method of a silicide layer according to the present invention, no plasma excitation or electric field is applied to the raw material gas. Surface reaction is employed which uses only thermal excitation is employed. Accordingly, a silicide layer can be formed in a manner having excellent covering capability without plasma damage to elements due to plasma excitation or damage to the substrate due to generated radicals.

In the method according to the present invention, an ambient temperature of the chamber which holds the substrate is set at a temperature at which the raw material gas is not pyrolyzed. Furthermore, the substrate is set to have a temperature which is higher than the ambient temperature of the chamber and at which the raw material gas can be pyrolyzed. Therefore, while the raw material gas is not pyrolyzed when it is introduced into the chamber, it is pyrolyzed on the surface of the substrate. Moreover, a "temperature at which the raw material gas can be pyrolyzed" is specific to the raw material gas and is determined uniquely.

Figure 5:
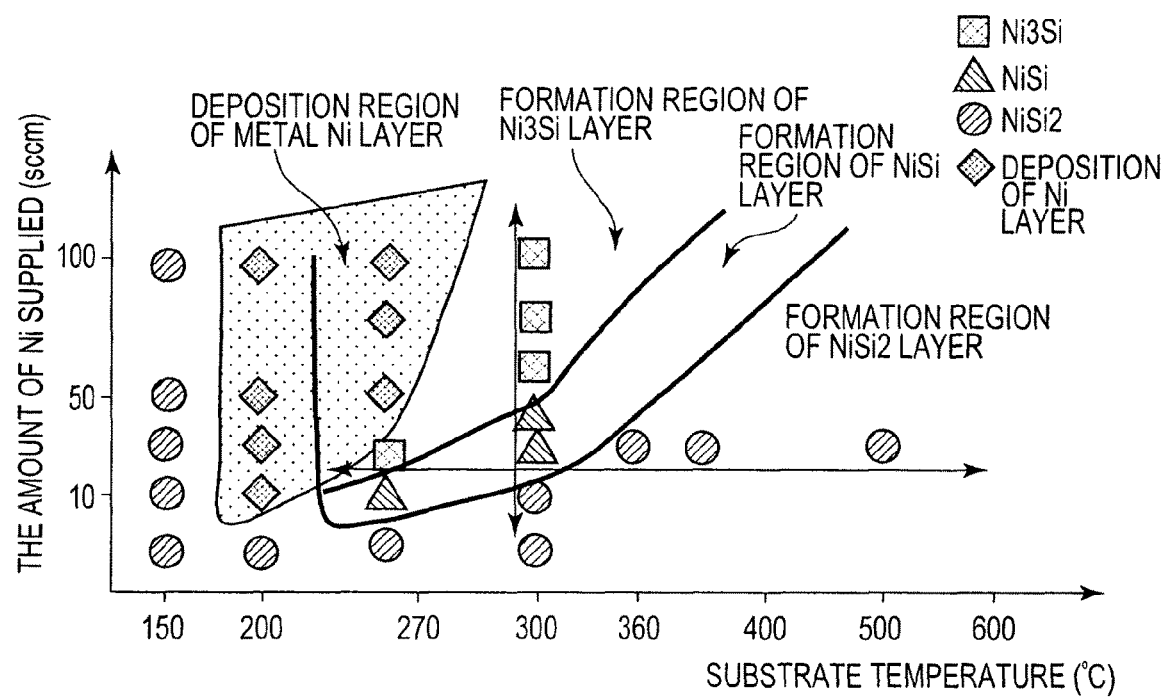
FIG. 5 is a diagram showing an example of relationship between a crystal structure of a silicide layer and the amount of raw material supplied and a substrate temperature according to the present invention.

FIG. 5 is a schematic graph showing the relationship between the composition of the silicide layer and the amount of Ni raw material supplied and the substrate temperature in a case where the pressure in the vacuum chamber is held constant. For example, in the case of the substrate temperature of 300° C. in FIG. 5, as the amount of Ni raw material supplied is increased, a silicide layer having a Ni-richer composition or crystal phase can be formed such that the crystal phase of the silicide layer changes to $Ni_3Si$, NiSi, and $NiSi_2$ in the order named. (See the compositions along a line parallel to the vertical axis in FIG. 5.) As the amount of Ni raw material supplied is increased, the silicide composition changes to a Ni-rich side because the amount of Ni adsorbed on the surface of the substrate per unit time is increased.

Furthermore, in a case where the amount of Ni raw material supplied is constant, as the substrate temperature is increased, a silicide layer having a Si-richer composition or crystal phase can be formed such that the composition of the silicide changes to $Ni_3Si$, NiSi, and $NiSi_2$ in the order named. (See the compositions along a line parallel to the horizontal axis in FIG. 5.) As the substrate temperature is increased, the silicide molecular composition changes to a Si-richer side because molecular motion of Ni atoms adsorbed on the surface of the substrate is activated by incasing the temperature and the Ni atoms are likely to be desorbed from the surface of the substrate.

Furthermore, in a region of substrate temperatures from 200° C. to 300° C., as the amount of the raw material gas supplied is increased, a deposition layer of Ni metal is formed on the surface of the substrate, thereby making it difficult to control the film thickness and the composition or crystal phase of the silicide layer. The Ni metal layer is deposited on the surface of the substrate because the amount of Ni atoms adsorbed on the surface of the substrate is more than the amount of Ni atoms adsorbed on the substrate and then consumed for formation of the silicide layer.

Thus, silicidation is not performed if the substrate temperature is lower than a temperature at which the raw material gas is pyrolyzed on the surface of the substrate. Furthermore, if the substrate temperature is higher than that temperature, then the adsorbed metal is desorbed from the surface of the substrate. Therefore, a formation rate of the silicide layer is decreased. Accordingly, the substrate temperature should be not less than a temperature at which the raw material gas is pyrolyzed and not more than a temperature at which the amount of the metallic element adsorbed on the exposed surface of the substrate is equal to the amount of the metallic element desorbed therefrom. Specifically, it is preferable that the substrate temperature may be in a range of 150° C. to 600° C.

Figure 6:
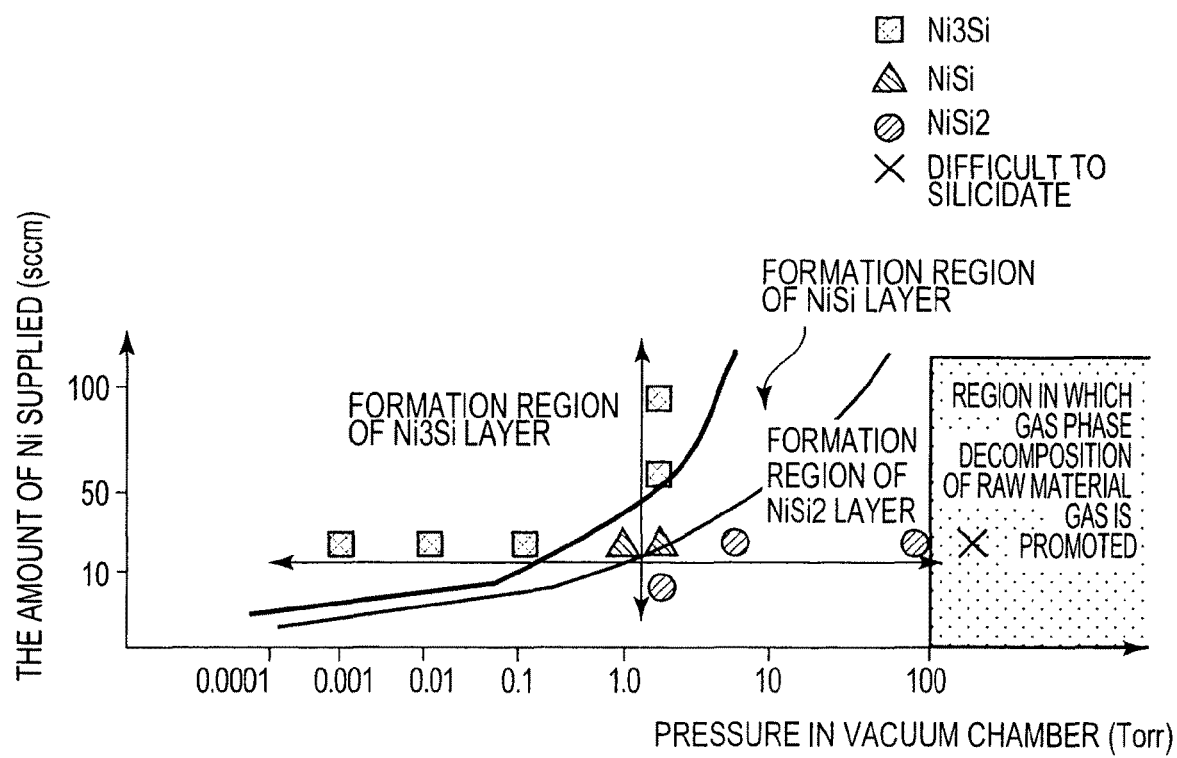
FIG. 6 is a diagram showing an example of relationship between a crystal structure of a silicide layer and the amount of raw material supplied and a pressure in a vacuum chamber according to the present invention.

Furthermore, FIG. 6 shows the relationship between the composition of the silicide layer and the amount of Ni raw material supplied and the pressure in the vacuum chamber in a case where the substrate temperature is held constant. As shown in FIG. 6, in the case of a constant substrate temperature and a constant amount of Ni raw material supplied, as the pressure in the vacuum chamber is increased, a silicide layer having a Si-richer composition or crystal phase can be formed such that the composition of the silicide layer changes to $Ni_3Si$, NiSi, and $NiSi_2$ in the order named. (See the compositions along a line parallel to the horizontal axis in FIG. 6.) This is because the moving speed of Ni atoms on the surface of the substrate is increased such that Ni atoms are unlikely to be adsorbed on the surface of the substrate as the pressure of the vacuum chamber is increased.

Furthermore, if the pressure in the vacuum chamber is high, decomposition of the material in a gas phase is promoted. Therefore, elements forming the raw material gas other than Ni are adsorbed on the substrate. Thus, silicidation reaction is suppressed so that a formation rate of a silicide layer is reduced.

Accordingly, if the vacuum chamber has a low pressure, such influence is reduced. Adsorption of Ni on the surface of the substrate and silicidation reaction is promoted. Thus, it is preferable that the pressure in the vacuum chamber may be not more than $1.33 \times 10^4$ Pa (100 Torr). Furthermore, in order to form a silicide layer by decomposition reaction due to thermal excitation on the surface of the substrate without decomposition of the raw material gas in a gas phase, it is more preferable that the pressure in the vacuum chamber be not more than $1.33 \times 10^3$ Pa (10 Torr).

Meanwhile, in the case where the substrate temperature and the pressure in the vacuum chamber are held constant in FIG. 6, as the amount of Ni raw material gas supplied is increased, a silicide layer having a Ni-richer composition or crystal phase can be formed such that the composition of the silicide layer is changed to $NiSi_2$, NiSi, and $Ni_3Si$ in the order named. (See the compositions along a line parallel to the vertical axis in FIG. 6.) This is because the amount of Ni atoms adsorbed on the surface of the substrate and involved in silicidation is increased according to an increase of the amount of Ni raw material supplied.

Figure 7:
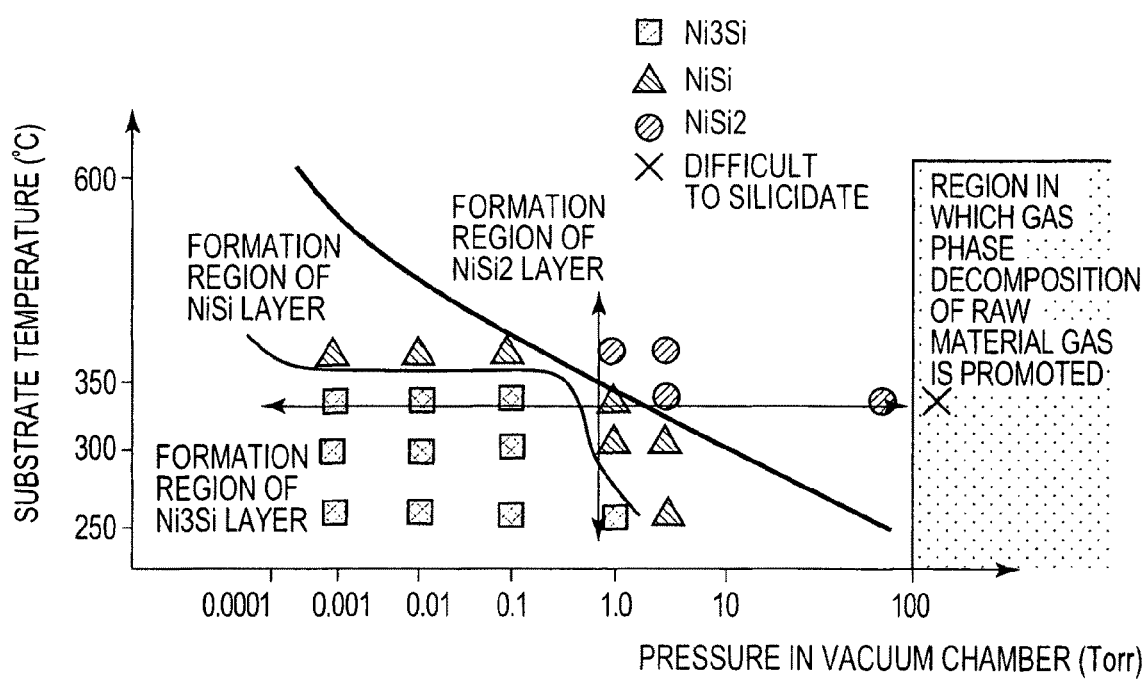
FIG. 7 is a diagram showing an example of relationship between a crystal structure of a silicide layer and a substrate temperature and a pressure in a vacuum chamber according to the present invention.

Furthermore, FIG. 7 shows the relationship between the composition of the silicide layer and the substrate temperature and the pressure in the vacuum chamber in a case where the amount of Ni supplied is held constant. As shown in FIG. 7, in the case of a constant amount of the Ni raw material gas supplied, as the substrate temperature is increased with a constant pressure in the vacuum chamber, a silicide layer having a Si-richer composition can be formed as in the above case. (See the compositions along a line parallel to the vertical axis in FIG. 7.) Moreover, in the case of a constant amount of Ni supplied and a constant substrate temperature in FIG. 7, as the pressure in the vacuum chamber is increased, a silicide layer having a Si-richer composition or crystal phase can be formed such that the composition of the silicide layer changes to $Ni_3Si$, NiSi, and $NiSi_2$ in the order named. (See the compositions along a line parallel to the horizontal axis of FIG. 7.

The experiments shown in FIGS. 5 to 7 were performed with substrates having a standard diameter of 6 inches and a formation apparatus for a metallic compound layer. Furthermore, the formation period for a metallic compound layer was set to be 20 minutes.

As shown in FIGS. 5 to 7, a silicide layer having a crystal phase of $NiSi_2$, NiSi, or $Ni_3Si$ can be formed by optimization of the substrate temperature, the pressure in the vacuum chamber, and the amount of the raw material gas supplied. This is because the amount of Ni adsorbed on the surface of the substrate relates to the substrate temperature, the pressure of the vacuum chamber, and the amount of the raw material gas supplied.

In the above explanation, there have been described cases in which the substrate is formed of silicon and a silicide layer is formed as the metallic compound layer. The aforementioned relationship of the substrate temperature, the pressure in the vacuum chamber, and the amount of the raw material gas supplied with the composition of the crystal phase is also applicable to cases in which the substrate is formed of germanium or silicon germanium and a germanium metallic compound layer or a silicon germanium compound layer is formed as the metallic compound layer.

(First Formation Sub-Step and Second Formation Sub-Step)

Furthermore, in a formation process of a metallic compound layer according to the present invention, a plurality of metallic compound layers having different compositions or properties can be formed by changing formation conditions for a metallic compound layer.

(1) As shown in FIG. 8A, metallic compound layers may be formed in the following manner: A first metallic compound layer is formed under first formation conditions (i.e. first formation sub-step). When the film thickness of the first metallic compound layer reaches a predetermined value, a second metallic compound layer is formed above the first metallic compound layer under second formation conditions (i.e. second formation sub-step). At that time, by forming the metallic compound layers such that at least the supply rate of the raw material gas (the raw material gas containing metal capable of forming a metallic compound layer such as a silicon metallic compound layer, a germanium metallic compound layer, or a silicon germanium metallic compound layer) under the second formation conditions is higher than that under the first formation conditions, the amount of metallic elements contained in the metallic compound layers can be changed in the film thickness direction as shown in FIG. 8B.

(2) As shown in FIG. 9A, a first metallic compound layer is formed under first formation conditions (i.e. first formation sub-step). When the film thickness of the first silicide layer reaches a predetermined value, a second metallic compound layer is formed above the first metallic compound layer under second formation conditions (i.e. second formation sub-step). At that time, by forming the metallic compound layers such that at least the substrate temperature under the second formation conditions is lower than that under the first formation conditions, the amount of metallic elements contained in the metallic compound layers can be changed in the film thickness direction as shown in FIG. 9B.

(3) As shown in FIG. 10A, a first metallic compound layer is formed under first formation conditions (i.e. first formation sub-step). When the film thickness of the first metallic compound layer reaches a predetermined value, a second metallic compound layer is formed above the first metallic compound layer under second formation conditions (i.e. second formation sub-step). At that time, by forming the metallic compound layers such that at least the pressure in the vacuum chamber under the second formation conditions is lower than that under the first formation conditions, the amount of metallic elements contained in the metallic compound layers can be changed in the film thickness direction as shown in FIG. 10B.

(4) A first metallic compound layer is formed under first formation conditions (i.e. first formation sub-step). When the film thickness of the first metallic compound layer reaches a predetermined value, a second metallic compound layer is formed above the first metallic compound layer under second formation conditions (i.e. second formation sub-step). At that time, by forming the metallic compound layers such that at least the metal content in the raw material gas under the second formation conditions is higher than that under the first formation conditions, the amount of metallic elements contained in the metallic compound layers can be changed in the film thickness direction.

Thus, a structure including first and second metallic compound layers having different compositions or crystal phases in a film thickness direction can be formed by continuously changing formation conditions for a metallic compound layer. In view of the process resistance to an etching process or the like and the resistance, it is preferable that the amount of metallic elements contained in the second metallic compound layer formed under the second formation conditions be greater than the amount of metallic elements contained in the first metallic compound layer formed under the first formation conditions.

For example, when a silicide layer is formed as a metallic compound layers, optimum conditions may be selected for the first formation conditions and the second formation conditions from the conditions shown in FIGS. 5, 6, and 7 with regard to the amount of raw material supplied, the substrate temperature, and the pressure in the vacuum chamber. Then processes may be performed under those selected conditions.

Furthermore, the formation methods (1) to (4) described above are applicable not only to the case where silicide layers are formed as metallic compound layers, but also to cases where germanium metallic compound layers or silicon germanium compound layers are formed. Metallic compound layers having different compositions or crystal phases are not limited to those having two layers, and thus three or more layers may be provided. When a plurality of metallic compound layers are provided, the same metallic element may be included in a metallic compound in each layer.

(Raw Material Gas)

In view of the resistance or the work function, it is preferable that a metallic element contained in the raw material gas be at least one type of metal selected from the group consisting of Ni, Pt, Co, W, and Ru. Furthermore, if elements contained in the raw material gas includes C, then C is adsorbed on the surface of the substrate so that the silicidation reaction is inhibited. Accordingly, it is preferable that elements contained in the raw material gas should not include C. Moreover, the raw material gas is preferably at least one type of raw material selected from the group consisting of $Ni(PF_3)_4$, $Ni(BF_2)_4$, $Pt(PF_3)_4$, $Pt(BF_2)_4$, $Co(PF_3)_6$, $Co(BF_2)_6$, $W(PF_3)_6$, $W(BF_2)_6$, $Ru(PF_3)_5$, and $Ru(BF_2)_5$.

(Formation Conditions for a Silicide Layer)

The relationship between formation conditions for a silicon metallic compound layer (silicide layer) (the substrate temperature, the pressure in the vacuum chamber, and the amount of raw material gas supplied) and a silicide composition to be formed when various types of raw material gases are used will be shown below.

1. When the raw material gas is $Ni(PF_3)_4$ or $Ni(BF_2)_4$, a silicide layer having a crystal phase of one of $NiSi_2$, NiSi, and $Ni_3Si$ can be formed.

(1) When the raw material gas is $Ni(PF_3)_4$ or $Ni(BF_2)_4$, it is preferable that the substrate temperature be in a range of 150° C. to 600° C. in order to form a silicide layer having a composition or crystal phase of $NiSi_2$ as shown in FIGS. 5, 6, and 7. Furthermore, in a region in which the substrate temperature is lower than 250° C., pyrolysis reaction of the raw material gas is inhibited on the surface of the substrate, so that a formation rate of the silicide layer is reduced. Moreover, in a region in which the substrate temperature is higher than 400° C., desorption of metal from the substrate is caused, so that a formation rate of the silicide layer is reduced. Accordingly, it is more preferable that the substrate temperature be in a range of 250° C. to 400° C.

Furthermore, it is preferable that the pressure in the vacuum chamber be not more than $1.33 \times 10^4$ Pa (100 Torr) in order to suppress gas phase decomposition components in the raw material gas. It is more preferable that the pressure in the vacuum chamber be in a range of $1.33 \times 10^{-2}$ Pa ($1 \times 10^{-4}$ Torr) to $1.33 \times 10^3$ Pa (10 Torr) in order to ensure both of decomposition of the raw material gas only on the surface of the substrate and controllability of the composition or crystal phase of the silicide layer with the amount of the raw material gas supplied. Particularly, according to the present invention, an $NiSi_2$ crystal phase can be formed at a temperature of 300° C. or less, which is lower than that in the prior art, by setting such formation conditions. Thus, it can be seen that the present invention is suitable to reduce a formation temperature of a silicide.

(2) When the raw material gas is $Ni(PF_3)_4$ or $Ni(BF_2)_4$, as shown in FIGS. 5, 6, and 7, it is preferable that the substrate temperature be in a range of 250° C. to 600° C. in order to form a silicide layer having a composition or crystal phase of NiSi. Furthermore, in a region in which the substrate temperature is higher than 400° C., desorption of metal from the substrate is caused, so that a formation rate of a silicide layer is reduced. Accordingly, it is more preferable that the substrate temperature be in a range of 250° C. to 400° C. Moreover, it is preferable that the pressure in the vacuum chamber be not more than $1.06 \times 10^4$ Pa (80 Torr) in order to suppress gas phase decomposition components in the raw material gas. It is more preferable that the pressure in the vacuum chamber be in a range of $1.33 \times 10^{-2}$ Pa ($1 \times 10^{-4}$ Torr) to $1.33 \times 10^3$ Pa (10 Torr) in order to ensure both of decomposition of the raw material gas only on the surface of the substrate and controllability of the composition or crystal phase of the silicide layer with the amount of the raw material gas supplied.

(3) When the raw material gas is $Ni(PF_3)_4$ or $Ni(BF_2)_4$, as shown in FIGS. 5, 6, and 7, it is preferable that the substrate temperature be in a range of 250° C. to 500° C. in order to form a silicide layer having a composition or crystal phase of $Ni_3Si$. Furthermore, in a region in which the substrate temperature is higher than 400° C., desorption of metal from the substrate is caused, so that a formation rate of a silicide layer is reduced. Accordingly, it is more preferable that the substrate temperature be in a range of 250° C. to 400° C. Moreover, it is preferable that the pressure in the vacuum chamber be not more than $1.33 \times 10^3$ Pa (10 Torr) in order to suppress gas phase decomposition components in the raw material gas. It is more preferable that the pressure in the vacuum chamber be in a range of $1.33 \times 10^{-2}$ Pa ($1 \times 10^{-4}$ Torr) to $6.66 \times 10^2$ Pa (5 Torr) in order to ensure both of decomposition of the raw material gas only on the surface of the substrate and controllability of the composition or crystal phase of the silicide layer with the amount of the raw material gas supplied.

(4) When the raw material gas is $Ni(PF_3)_4$ or $Ni(BF_2)_4$, a first silicide layer having a crystal phase of $NiSi_2$ can be formed under first formation conditions (first silicidation sub-step). A second silicide layer having a crystal phase of at least one of NiSi and $Ni_3Si$ may be formed under second formation conditions (second silicidation sub-step).

In view of the process resistance to etching and the resistance, it is preferable that a second silicide layer having a crystal phase of NiSi be formed on a first silicide layer having a crystal phase of $NiSi_2$. Furthermore, optimum conditions may be selected for the first formation conditions and the second formation conditions from the conditions shown in FIGS. 5, 6, and 7 with regard to the amount of raw material supplied, the substrate temperature, and the pressure in the vacuum chamber. Then processes may be performed under those selected conditions.

2. When the raw material gas is $Co(PF_3)_6$ or $Co(BF_2)_6$, a silicide layer having a crystal phase of one of $CoSi_2$, CoSi, and $Co_3Si$ can be formed.

(1) When the raw material gas is $Co(PF_3)_6$ or $Co(BF_2)_6$, it is preferable that the substrate temperature be in a range of 150° C. to 600° C. in order to form a silicide layer having a composition or crystal phase of $CoSi_2$. It is more preferable that the substrate temperature be in a range of 250° C. to 400° C. in order to ensure a formation rate. Furthermore, it is preferable that the pressure in the vacuum chamber be not more than $1.33 \times 10^4$ Pa (100 Torr). It is more preferable that the pressure in the vacuum chamber be in a range of 13.3 Pa (0.1 Torr) to $1.33 \times 10^3$ Pa (10 Torr) in order to ensure a formation rate.

(2) When the raw material gas is $Co(PF_3)_6$ or $Co(BF_2)_6$, it is preferable that the substrate temperature be in a range of f250° C. to 600° C. in order to form a silicide layer having a composition or crystal phase of CoSi. It is more preferable that the substrate temperature be in a range of 250° C. to 400° C. in order to ensure a formation rate. It is preferable that the pressure in the vacuum chamber be not more than $1.33 \times 10^4$ Pa (100 Torr). It is more preferable that the pressure in the vacuum chamber be in a range of $1.33 \times 10^{-2}$ Pa ($1 \times 10^{-4}$ Torr) to $1.33 \times 10^3$ Pa (10 Torr) in view of controllability of the formation rate.

(3) When the raw material gas is $Co(PF_3)_6$ or $Co(BF_2)_6$, it is preferable that the substrate temperature be in a range of 250° C. to 500° C. in order to form a silicide layer having a composition or crystal phase of $Co_3Si$. It is more preferable that the substrate temperature be in a range of 250° C. to 400° C. in order to ensure a formation rate. It is preferable that the pressure in the vacuum chamber be not more than $1.33 \times 10^4$ Pa (100 Torr). It is more preferable that the pressure in the vacuum chamber be in a range of $1.33 \times 10^{-2}$ Pa ($1 \times 10^{-4}$ Torr) to $1.33 \times 10^3$ Pa (10 Torr) in view of controllability of the formation rate.

(4) When the raw material gas is $Co(PF_3)_6$ or $Co(BF_2)_6$, a first silicide layer having a crystal phase of $CoSi_2$ can be formed under first formation conditions (first silicidation sub-step). A second silicide layer having a crystal phase of $Co_3Si$ may be formed under second formation conditions (second silicidation sub-step).

When the raw material gas is $Co(PF_3)_6$ or $Co(BF_2)_6$, it is preferable that a silicide layer having a crystal phase of CoSi be formed on $CoSi_2$ in view of the process resistance to etching and the resistance.

EXAMPLES

Examples of the present invention will be described below

A silicon substrate or a substrate in which a silicon oxide film having a film thickness of 10 nm to 20 nm was formed on a silicon substrate by a CVD method and a polysilicon layer having a film thickness of 50 nm to 150 nm was formed on the substrate by a CVD method was used as the substrate. In each Example or Comparable Example, a non-doped, As-doped, or B-doped substrate was used for the polysilicon layer.

The formation apparatus shown in FIG. 1 was used to form a silicide layer on the substrate. In each Example or Comparable Example, the substrate temperature was set in a range of 150° C. to 700° C., and the pressure in the vacuum chamber was set in a range of $1.33 \times 10^{-2}$ Pa ($1 \times 10^{-4}$ Torr) to $1.33 \times 10^{4}$ Pa (100 Torr). The temperatures of the vacuum chamber, the gas supply system, the gas inlet, and the showerhead were set at 150° C. or less (temperatures at which the raw material gas was not pyrolyzed). Furthermore, $N_2$ was used as the carrier gas. In each Example or Comparable Example, the amount of the raw material gas supplied was set in a range of 2 sccm to 100 sccm by the mass-flow controller, and the raw material gas was supplied to the substrate for 1 minute to 100 minutes.

Then, by changing the substrate temperature, the pressure in the vacuum chamber, the amount of the raw material gas supplied, and the supply period of the raw material gas, conditions were set such that a Ni layer was deposited on the substrate or such that no Ni layer was deposited on the substrate.

Example 1

A substrate having a non-doped polysilicon layer was used, and a silicide layer was formed under conditions in which no deposition layer of Ni metal was formed on a surface of the substrate. At the time of forming a silicide layer, the pressure in the vacuum chamber was set at $3.33 \times 10^{2}$ Pa (2.5 Torr), the supply period of the raw material gas was set at 45 minutes, the amount of the raw material gas supplied was set at 20 sccm, and the substrate temperature was set at 360° C. $Ni(PF_3)_4$ was used as the raw material gas. The raw material gas of $Ni(PF_3)_4$ can be pyrolyzed at a temperature of 360° C.

FIG. 11A shows a cross-sectional structure of the silicide layer. It can be seen from FIG. 11A that the polysilicon layer could uniformly be silicidated on the surface of the substrate without a deposition layer of Ni metal being formed thereon. Furthermore, it was confirmed by TEM evaluation that the surface was not subjected to any Ni deposition layer or damage due to etching caused by the raw material gas.

Comparative Example 1

A silicide layer was formed on a substrate having a non-doped polysilicon layer under such conditions in which a deposition layer of Ni metal was formed on the substrate. At the time of forming a silicide layer, the substrate temperature was set at 296° C., the pressure in the vacuum chamber was set at $3.33 \times 10^{2}$ Pa (2.5 Torr), the supply period of the raw material gas was set at 20 minutes, and the amount of the raw material gas supplied was set at 80 sccm. $Ni(PF_3)_4$ was used as the raw material gas. The raw material gas of $Ni(PF_3)_4$ can be pyrolyzed at a temperature of 296° C.

FIG. 11B shows a cross-sectional structure of the silicide layer. It can be seen from FIG. 11B that only an extremely thin silicide layer was formed in a surface region of the polysilicon when a Ni metal layer was deposited on the substrate. Thus, it was difficult to silicidate the entire polysilicon layer. It is conceivable that this silicide layer was formed at the beginning of the supply of the raw material gas when Ni in the raw material gas reacted with the polysilicon in a state such that any Ni metal layer had not been deposited on the polysilicon layer.

Example 2

In the aforementioned Comparative Example 1, the substrate temperature, the formation pressure, and the supply period of the raw material gas were set at the same values as those in the case of FIG. 11B. The amount of the raw material gas supplied was changed to 20 sccm or less. As a result, it was confirmed that a silicide layer was uniformly formed on the surface of the substrate without deposition of Ni thereon as in the case of FIG. 11A. Thus, in the present invention, it appears to be important to set the amount of the raw material gas supplied to be not more than the amount at which a Ni metal layer begins to be deposited on the surface of the substrate.

Example 3

Figure 12:
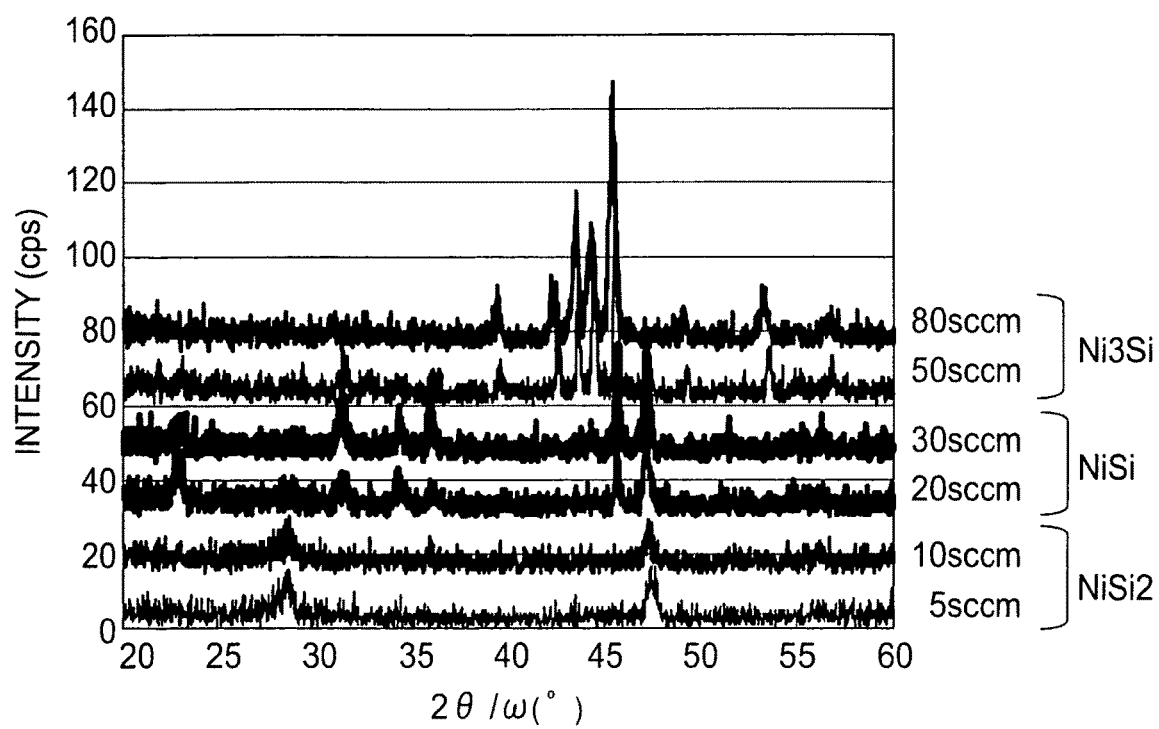
FIG. 12 is a diagram showing XRD spectra of silicide layers in Example 3 of the present invention.

A non-doped polysilicon layer having a thickness of 150 nm was used as the substrate. The substrate temperature was set at 296° C., the pressure in the vacuum chamber was set at $3.33 \times 10^{2}$ Pa (2.5 Torr), the supply period of the raw material gas was set at 20 minutes, and the amount of the raw material gas supplied was changed. $Ni(PF_3)_4$ was used as the raw material gas. For each of the amounts of the raw material gas supplied, a silicide layer could be formed uniformly on a surface of the substrate without deposition of Ni thereon. FIG. 12 shows dependency of the amount of the raw material gas supplied on an XRD spectrum of the crystal phase of the silicide layer thus formed.

It can be seen from FIG. 12 that a silicide layer having a Ni-richer composition or crystal phase could be formed such that the composition of the silicide layer changed to $NiSi_2$, $NiSi$, and $Ni_3Si$ in the order named as only the amount of the raw material gas supplied was increased. Furthermore, for each of the amounts of the raw material gas supplied, it can be seen that there were no spectra due to mixed phases of the crystal phase and that the silicide layer had good crystallinity.

As shown in Examples 1-3, by using a formation method of a silicide layer according to the present invention, a silicide layer can be formed with good controllability of its crystal phase even without an annealing process corresponding to the crystal structure, which has heretofore been required. Furthermore, it was confirmed that a uniform $NiSi_2$ crystal phase was formed even at a substrate temperature of 300° C. or less.

Example 4

Figure 13:
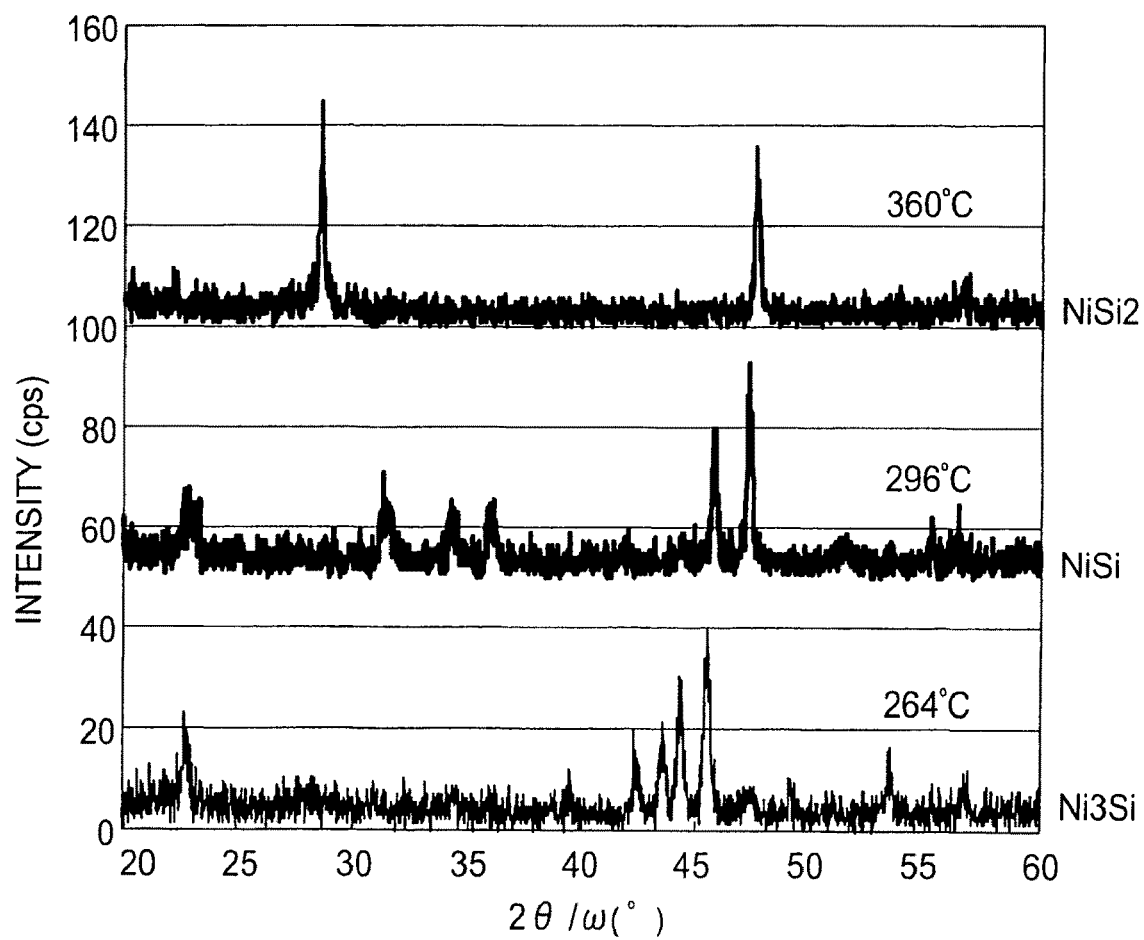
FIG. 13 is a diagram showing XRD spectra of silicide layers in Example 4 according to the present invention.

A substrate including a non-doped polysilicon layer having a thickness of 150 nm was used. The pressure in the vacuum chamber was set at $3.33 \times 10^{2}$ Pa (2.5 Torr), the amount of the raw material gas supplied was set at 20 sccm, the supply period of the raw material gas was set in a range of 30 minutes to 60 minutes, and the substrate temperature was changed. $Ni(PF_3)_4$ was used as the raw material gas. For each of the substrate temperatures, a silicide layer could be formed uniformly on a surface of the substrate without deposition of Ni thereon. FIG. 13 shows dependency of the substrate temperature on an XRD spectrum of the crystal phase of the silicide layer thus formed. The raw material gas of $Ni(PF_3)_4$ can be pyrolyzed at a temperature of 264° C.

It can be seen from FIG. 13 that a silicide layer having a Si-richer composition or crystal phase could be formed such that the composition of the silicide layer changed to $Ni_3Si$, $NiSi$, and $NiSi_2$ in the order named as only the substrate temperature was increased. Thus, by using a formation method of a silicide layer according to the present invention, a silicide layer can be formed with good controllability of its crystal phase even without an annealing process corresponding to the crystal structure, which has heretofore been required.

Reference Example 1

As with the aforementioned Examples, it was confirmed that a silicide layer having a Si-richer composition or crystal phase could be formed such that the composition of the silicide layer changed to $Ni_3Si$, $NiSi$, and $NiSi_2$ in the order named as the pressure in the vacuum chamber was increased without changing the substrate temperature or the amount of the raw material supplied. Furthermore, it was confirmed that decomposition of the raw material gas in a gas phase was promoted in a region above $1.33 \times 10^4$ Pa (100 Torr) so that it was difficult to control the film thickness of the silicide layer and to control the composition or crystal phase by formation conditions. Furthermore, it was confirmed that decomposition of the raw material gas in a gas phase could be inhibited in a region not more than $1.33 \times 10^3$ Pa (10 Torr) so as to ensure both of the formation rate of the silicide layer and the controlled range of the composition or crystal phase by formation conditions.

The relationship between the amount of the raw material supplied, the substrate temperature, and the pressure in the vacuum chamber, and the composition or crystal phase of the silicide layer in the aforementioned Examples is summarized as shown in FIGS. 5, 6, and 7. The black circles, the black triangles, and the black squares in the figures represent silicide layers having compositions or crystal phases of $NiSi_2$, $NiSi$, and $Ni_3Si$ formed in the above Examples, respectively. Furthermore, the black rhombuses in the figures represent a state in which a Ni metal layer was deposited on the surface of the substrate so that it was difficult to change the film thickness and the composition or crystal phase of the silicide layer by formation conditions. The marks "x" in the figures represent a state in which decomposition of the raw material gas in a gas phase was promoted so that it was difficult to change the film thickness and the composition or crystal phase of the silicide layer by formation conditions.

Thus, in a formation method of a silicide layer according to the present invention, by setting the amount of the raw material gas supplied to be not more than the amount at which Ni begins to be deposited, a silicide layer can be formed so that the composition or crystal phase of the silicide layer are controlled in a wide range by the amount of the raw material gas supplied, the substrate temperature, and the pressure in the vacuum chamber.

Example 5

A non-doped polysilicon layer having a thickness of 80 nm and substrates in which As and B were doped into a polysilicon layer having a thickness of 80 nm at $6 \times 10^{15}$ cm$^2$ by ion implantation were used as the substrates. The formation of a silicide layer was performed under conditions in which the substrate temperature was 300° C., the pressure of the vacuum chamber was $3.33 \times 10^2$ Pa (2.5 Torr), and the amount of the raw material supplied was 2 sccm, and the formation period was 85 minutes. $Ni(PF_3)_4$ was used as the raw material gas. The raw material gas of $Ni(PF_3)_4$ can be pyrolyzed at a temperature of 300° C.

Figure 14:
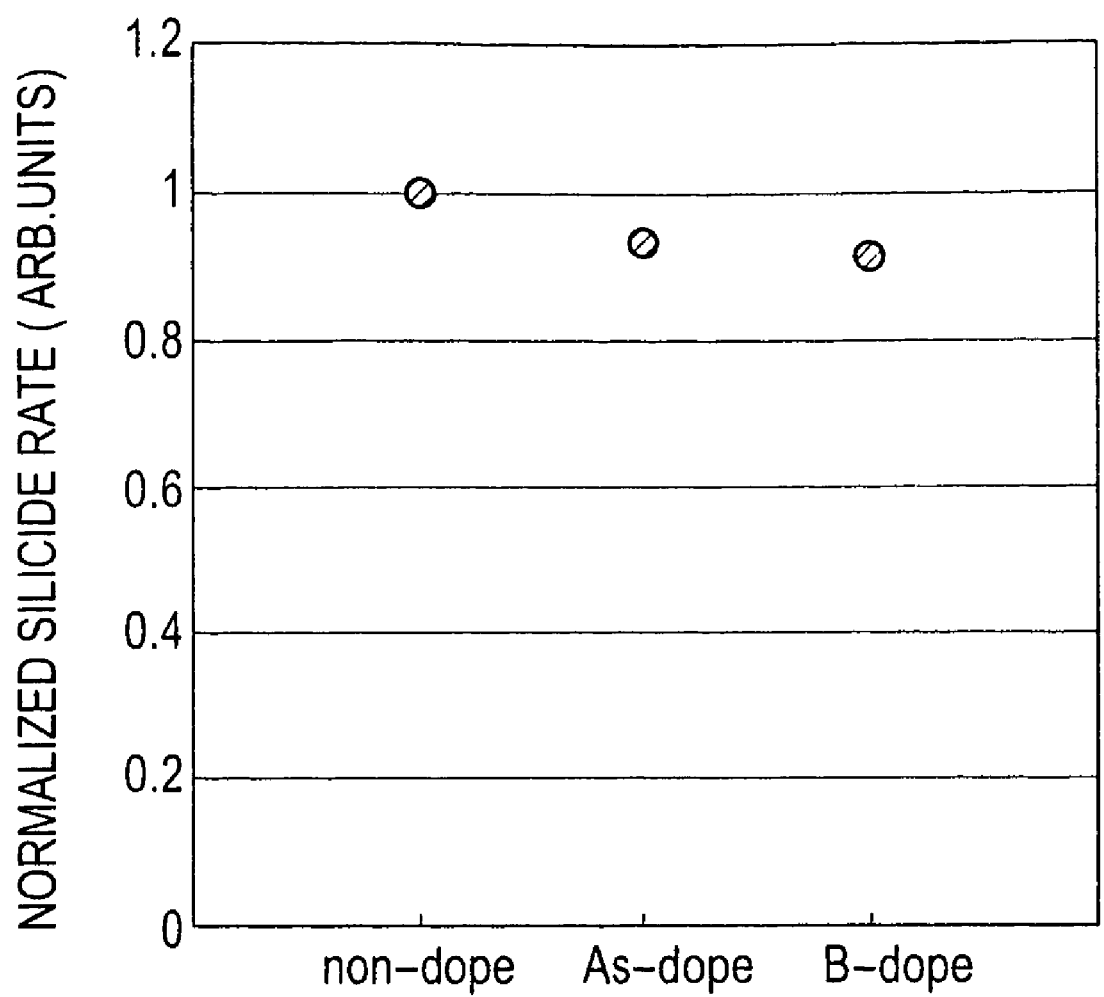
FIG. 14 is a diagram showing silicide rates in cases of a non-doped substrate and substrates doped with impurities in Example 5 of the present invention.

In each case, a silicide layer could be formed uniformly on a surface of the substrate without deposition of Ni thereon. FIG. 14 shows formation rates in those cases. The silicide rate is normalized by a silicide rate of the non-doped substrate (a formation rate of a silicide layer in the thickness direction).

It can be seen from FIG. 14 that reduction of the formation rate due to the impurity doping was within 10% and that the formation rate was hardly affected by the impurity doping. Furthermore, it can be seen that the types of impurities hardly affected the formation rates. Additionally, it was confirmed by XRD that the formed silicide layers were $NiSi_2$ irrespective of doping.

It can be seen from those results that, in a formation method of a silicide layer according to the present invention, a formation rate and a crystal phase are not greatly changed in a formation region of a silicide layer at low temperatures irrespective of the amount of impurity to a substrate and the type of impurity and that the formation method according to the present invention is suitable to form a silicide layer on a substrate into which an impurity has been doped.

Example 6

Figure 15A:
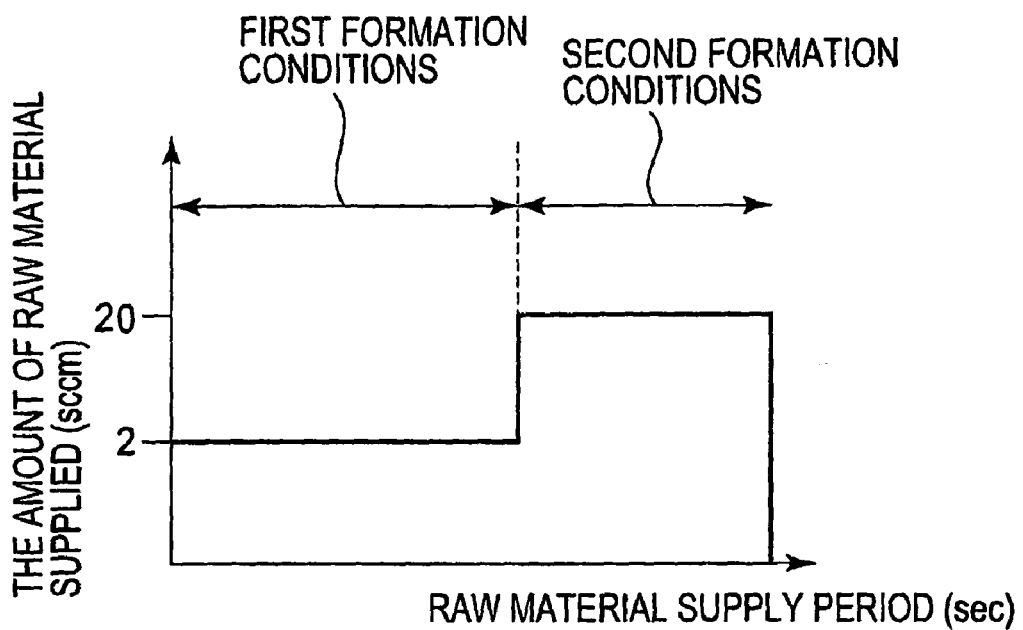
FIG. 15A is a diagram showing first and second formation conditions in Example 6 of the present invention.

With use of a substrate including a non-doped polysilicon layer having a thickness of 50 nm, as shown in FIG. 15A, the raw material was supplied at 2 sccm for 80 minutes to form a first silicide layer under conditions in which the substrate temperature was 300° C. and the pressure in the vacuum chamber was $3.33 \times 10^2$ Pa (2.5 Torr) (first silicidation). Then the raw material gas was supplied at 20 sccm for 200 seconds to form a second silicide layer under such conditions in which the substrate temperature was 300° C. and the pressure in the vacuum chamber was $3.33 \times 10^2$ Pa (2.5 Torr) (second silicidation). $Ni(PF_3)_4$ was used as the raw material gas. In the first and second silicidation, a silicide layer could be formed uniformly on a surface of the substrate without deposition of Ni thereon. As a result, it was confirmed by SEM and XPS that the second silicide layer having an NiSi crystal phase was formed on the first silicide layer having an $NiSi_2$ crystal phase.

Example 7

Figure 15B:
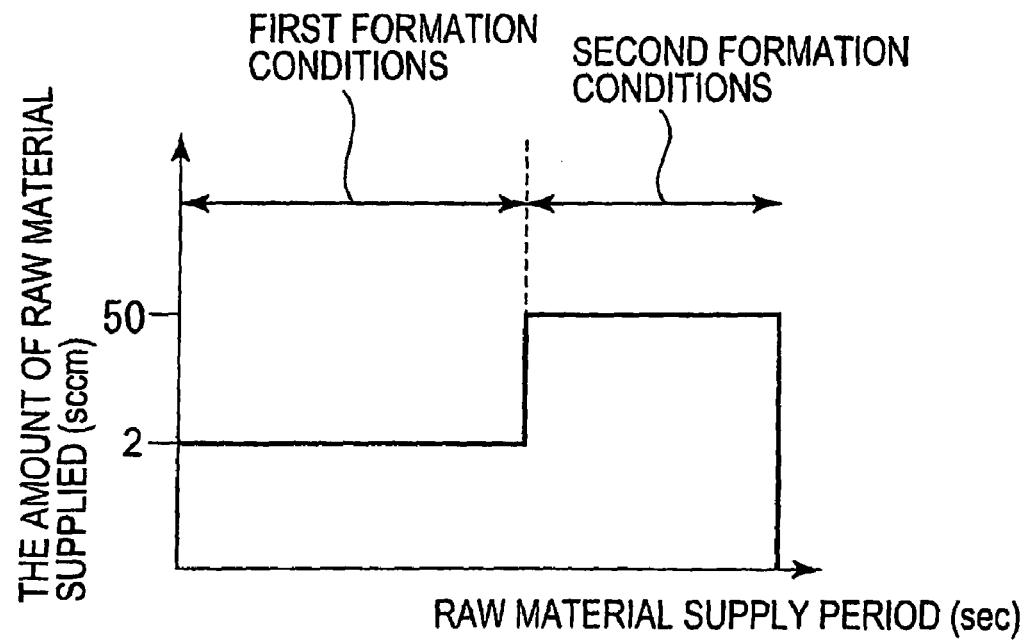
FIG. 15B is a diagram showing first and second formation conditions in Example 7 of the present invention.

With use of a substrate including a non-doped polysilicon layer having a thickness of 50 nm, as shown in FIG. 15B, a raw material gas was supplied at 2 sccm for 80 minutes to form a first silicide layer under first formation conditions in which the substrate temperature was 300° C. and the pressure of the vacuum chamber was $3.33 \times 10^2$ Pa (2.5 Torr) (first silicidation). Then the raw material gas was supplied at 50 sccm for 200 seconds to form a second silicide layer under second formation conditions in which the substrate temperature was 300° C. and the pressure of the vacuum chamber was $3.33 \times 10^2$ Pa (2.5 Torr) (second silicidation). $Ni(PF_3)_4$ was used as the raw material gas. In the first and second silicidation, a silicide layer could be formed uniformly on a surface of the substrate without deposition of Ni thereon.

As a result, it was confirmed by SEM and XPS that the second silicide layer having an $Ni_3Si$ crystal phase was formed on the first silicide layer having an $NiSi_2$ crystal phase.

Example 8

Figure 16A:
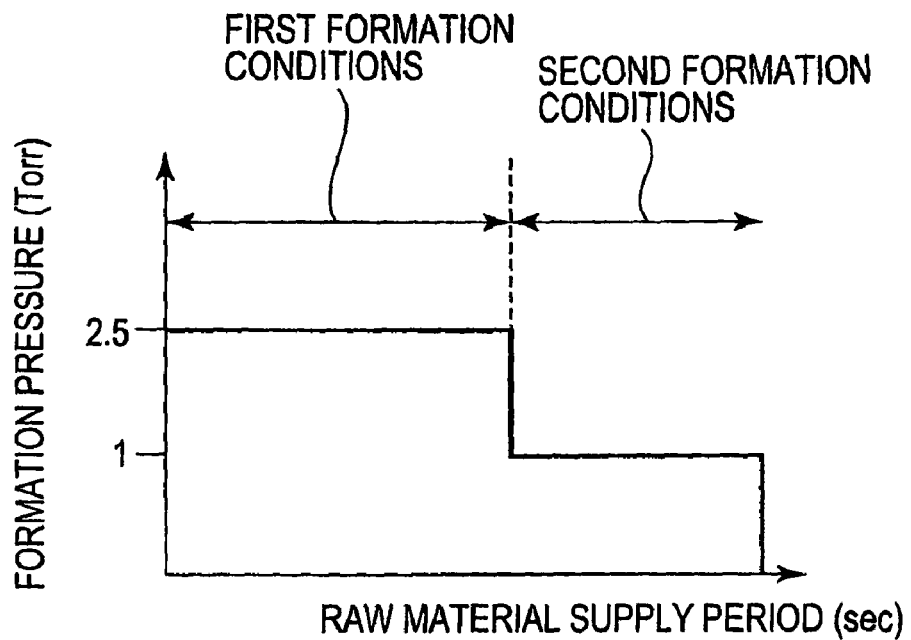
FIG. 16A is a diagram showing first and second formation conditions in Example 8 of the present invention.

With use of a substrate including a non-doped polysilicon layer having a thickness of 50 nm, as shown in FIG. 16A, a raw material gas was supplied at 20 sccm for 45 minutes to form a first silicide layer under first formation conditions in which the substrate temperature was 360° C. and the pressure of the vacuum chamber was $3.33 \times 10^2$ Pa (2.5 Torr) (first silicidation). Then the raw material gas was supplied at 20 sccm for 10 minutes to form a second silicide layer under second formation conditions in which the substrate temperature was 360° C. and the pressure of the vacuum chamber was $1.33 \times 10^2$ Pa (1 Torr) (second silicidation). $Ni(PF_3)_4$ was used as the raw material gas. In the first and second silicidation, a silicide layer could be formed uniformly on a surface of the substrate without deposition of Ni thereon.

As a result, it was confirmed by SEM and XPS that the second silicide layer having an NiSi crystal phase was formed on the first silicide layer having an $NiSi_2$ crystal phase.

Example 9

Figure 16B:
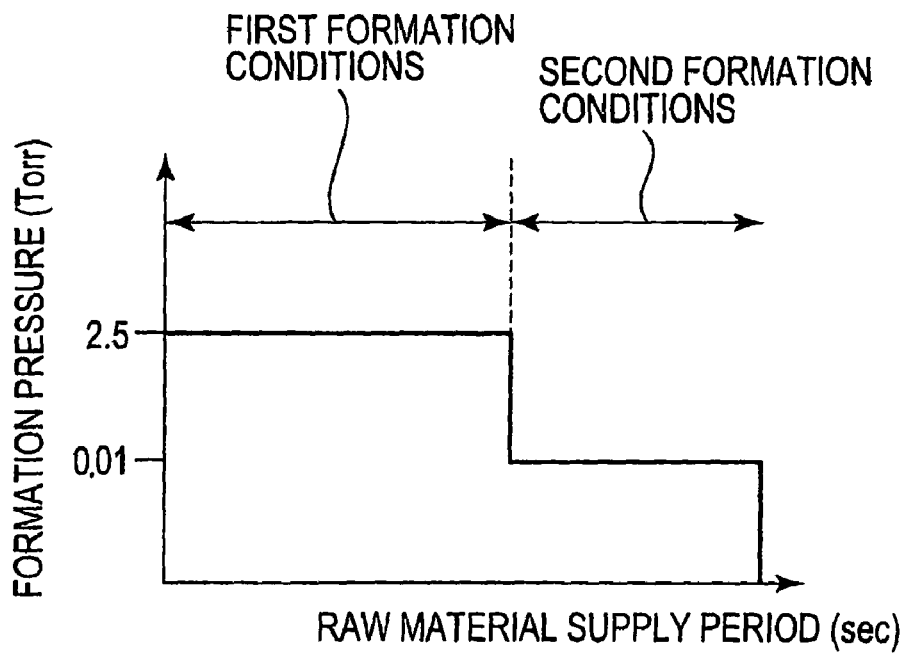
FIG. 16B is a diagram showing first and second formation conditions in Example 9 of the present invention.

With use of a substrate including a non-doped polysilicon layer having a thickness of 50 nm, as shown in FIG. 16B, a raw material gas was supplied at 20 sccm for 45 minutes to form a first silicide layer under first formation conditions in which the substrate temperature was 360° C. and the pressure of the vacuum chamber was $3.33 \times 10^2$ Pa (2.5 Torr) (first silicidation). Then the raw material gas was supplied at 20 sccm for 10 minutes to form a second silicide layer under second formation conditions in which the substrate temperature was 360° C. and the pressure of the vacuum chamber was 1.33 Pa (0.01 Torr) (second silicidation). $Ni(PF_3)_4$ was used as the raw material gas. In the first and second silicidation, a silicide layer could be formed uniformly on a surface of the substrate without deposition of Ni thereon. As a result, it was confirmed by SEM and XPS that the second silicide layer having an $Ni_3Si$ crystal phase was formed on the first silicide layer having an $NiSi_2$ crystal phase.

Example 10

Figure 17:
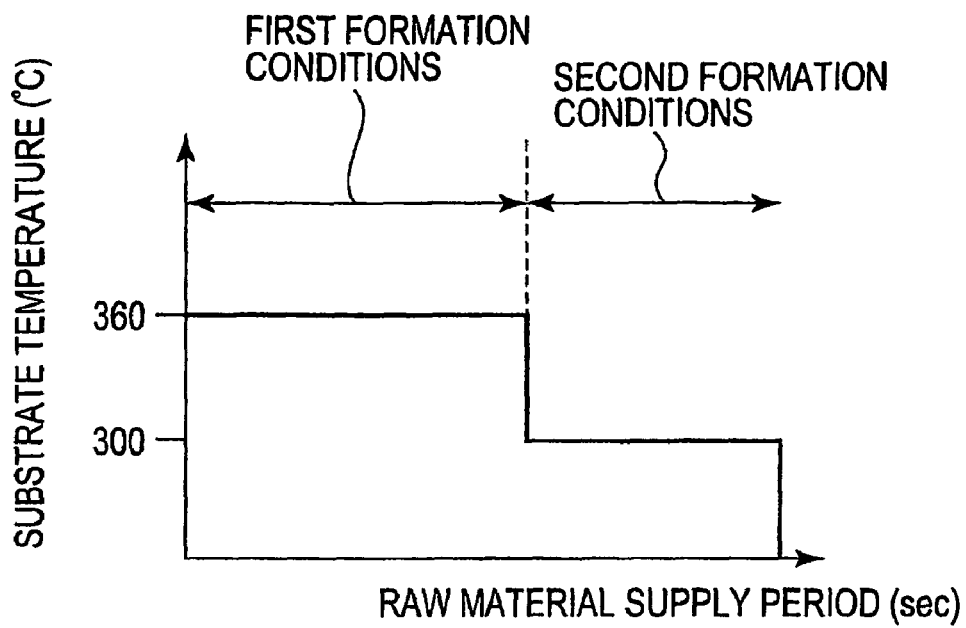
FIG. 17A is a diagram showing first and second formation conditions in Example 10 of the present invention.
FIG. 17B is a diagram showing first and second formation conditions in Example 11 of the present invention.
Figure 17:
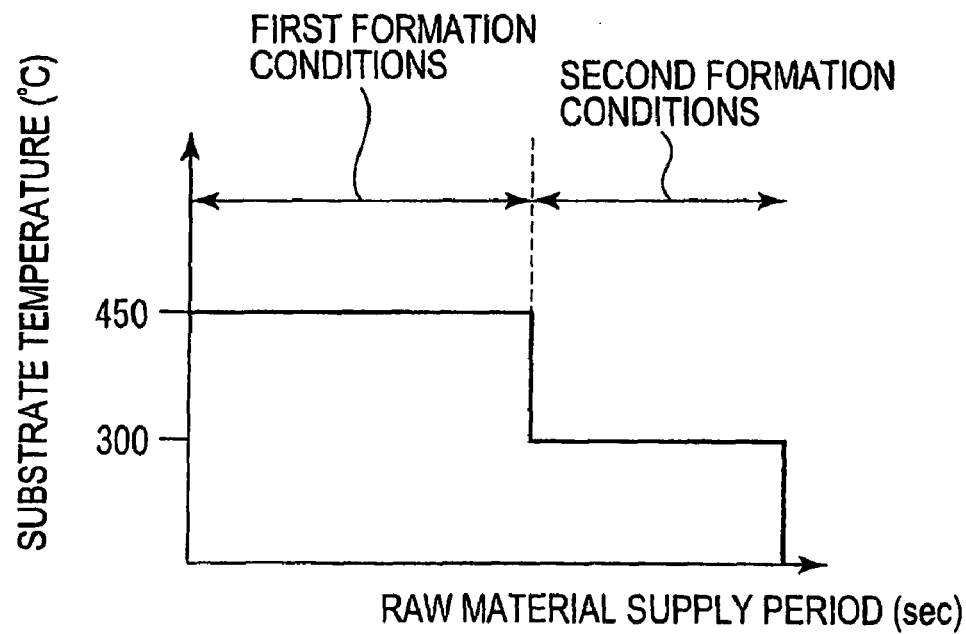

With use of a substrate including a non-doped polysilicon layer having a thickness of 50 nm, as shown in FIG. 17A, a raw material gas was supplied at 20 sccm for 45 minutes to form a first silicide layer under first formation conditions in which the substrate temperature was 360° C. and the pressure of the vacuum chamber was $3.33 \times 10^2$ Pa (2.5 Torr) (first silicidation). Then the raw material gas was supplied at 20 sccm for 10 minutes to form a second silicide layer under second formation conditions in which the substrate temperature was 300° C. and the pressure of the vacuum chamber was $3.33 \times 10^2$ Pa (2.5 Torr) (second silicidation). $Ni(PF_3)_4$ was used as the raw material gas. In the first and second silicidation, a silicide layer could be formed uniformly on a surface of the substrate without deposition of Ni thereon.

As a result, it was confirmed by SEM and XPS that the second silicide layer having an NiSi crystal phase was formed on the first silicide layer having an $NiSi_2$ crystal phase.

Example 11

With use of a substrate including a non-doped polysilicon layer having a thickness of 50 nm, as shown in FIG. 17B, a raw material gas was supplied at 80 sccm for 30 minutes to form a first silicide layer under first formation conditions in which the substrate temperature was 450° C. and the pressure of the vacuum chamber was $3.33 \times 10^2$ Pa (2.5 Torr) (first silicidation). Then the raw material gas was supplied at 80 sccm for 5 minutes to form a second silicide layer under second formation conditions in which the substrate temperature was 300° C. and the pressure of the vacuum chamber was $3.33 \times 10^2$ Pa (2.5 Torr) (second silicidation). $Ni(PF_3)_4$ was used as the raw material gas. In the first and second silicidation, a silicide layer could be formed uniformly on a surface of the substrate without deposition of Ni thereon. $Ni(PF_3)_4$ of the raw material gas can be pyrolyzed at a temperature of 450° C. As a result, it was confirmed by SEM and XPS that the second silicide layer having an $Ni_3Si$ crystal phase was formed on the first silicide layer having an $NiSi_2$ crystal phase.

Although the prior art requires annealing processes corresponding to individual compositions or crystal phases in order to form a multilayer structure of silicide layers having different compositions or crystal phases, the aforementioned results show that a formation method of a silicide layer according to the present invention can continuously form silicide layers having different compositions or crystal phases according to formation profiles for the silicide layers. Therefore, a formation method of a silicide layer according to the present invention can reduce the number of processes required as compared to the prior art.

Example 12

A silicide layer was formed on a silicon substrate including a non-doped polysilicon layer having a trench structure. Formation conditions at that time were set such that the amount of the raw material supplied was 20 sccm, that the pressure of the vacuum chamber was $3.33 \times 10^3$ Pa (25 Torr), that the substrate temperature was 300° C., and that the raw material supply period was 20 minutes. $Ni(PF_3)_4$ was used as the raw material gas. In this case, a silicide layer could be formed uniformly on a surface of the substrate without deposition of Ni thereon. Furthermore, it was also confirmed that the silicide layer was formed uniformly without deposition of Ni metal along side surfaces of the trench structure.

Example 13

A substrate including a silicon substrate, a silicon oxide film having a thickness of 35 nm, and a non-doped polysilicon layer having a thickness of 80 nm in the order named was used, and a silicide layer was formed on the polysilicon layer.

Conditions at the time of the silicidation were set such that the amount of the raw material gas supplied was 2 sccm, that the raw material supply period was 85 min, that the substrate temperature was 300° C., and that the pressure in the vacuum chamber was $3.33 \times 10^2$ Pa (2.5 Torr). $Ni(PF_3)_4$ was used as the raw material gas. In this case, a silicide layer could be formed uniformly on a surface of the substrate without deposition of Ni thereon. When the silicide layer was used as a gate electrode and leakage characteristics were evaluated, then the leakage characteristics were not deteriorated by the silicidation.

Reference Example 2

The above Example 13 used a silicon substrate. In a case where a germanium substrate or a silicon germanium substrate was used, Ni could also be contained without deposition of Ni on a surface of the germanium substrate or the silicon germanium substrate by setting the amount of a raw material gas supplied to be not more than the amount at which Ni begins to be deposited. Furthermore, it was confirmed that the content of Ni could be changed by the amount of the raw material gas supplied, the substrate temperature, and the pressure in the vacuum chamber. Moreover, it was confirmed that a multilayer structure in which the Ni content was increased at an upper portion in germanium or silicon germanium could be formed.

Reference Example 3

In this example, a silicide layer was formed while the temperature of the inlet 108 in the formation apparatus shown in FIG. 1 was set at 160° C. For formation of the silicide layer, a substrate having a non-doped polysilicon layer was used, the substrate temperature was set at 296° C., and Ni(PF$_3$)$_4$ was used as a raw material gas and supplied at 20 sccm for 20 minutes. At that time, the pressure in the vacuum chamber was set at 3.33×10$^2$ Pa (2.5 Torr). FIG. 18A shows a cross-sectional measurement result of a silicide formed in this example, which was taken by SEM. It can be seen from FIG. 18A that the silicide layer was hardly formed when the temperature of the gas inlet was 160° C. This suggests that the raw material gas was decomposed at the gas inlet and did not reach the substrate to be processed.

Example 14

A silicide layer was formed under the same conditions as the Reference Example 3 except that the temperature of the gas inlet 108 was set at 150° C. In this case, the silicide layer could be formed uniformly on a surface of the substrate without deposition of Ni thereon. FIG. 18B shows this silicide layer. Unlike FIG. 18A, it can be seen that the silicide layer was formed. Thus, the temperature of the inlet should be controlled to be not more than 150° C.

Example 15

In this example, conditions were the same as Example 1 except that Pt(PF$_3$)$_4$ was used as a raw material gas to form a silicide layer. The raw material of Pt(PF$_3$)$_4$ gas can be pyrolyzed at a temperature of 360° C. When the same evaluation as in Example 1 was performed for this example, it was confirmed that a silicide layer could be formed on silicon under conditions in which no Pt metal layer was deposited on the silicon.

Furthermore, a first silicide layer was formed under first formation conditions (first silicidation), and a second silicide layer was continuously formed under second formation conditions in which the amount of the raw material supplied was larger than that in the first formation conditions (second silicidation). It was confirmed that the second silicide layer having a high Pt content was formed above the first silicide layer formed under the first formation conditions. In this case, the substrate temperature at the first and second silicidation was 300° C., and the pressure in the vacuum chamber was 3.33×10$^2$ Pa (2.5 Torr). Thus, the substrate temperature and the pressure in the vacuum chamber were the same for the first and second silicidation. The supply periods of the raw material gas at the first and second silicidation were set at 45 minutes and 10 minutes, respectively.

Furthermore, a first silicide layer was formed under first formation conditions (first silicidation), and a second silicide layer was continuously formed under second formation conditions in which the substrate temperature was lower than that in the first formation conditions (second silicidation). It was confirmed that the second silicide layer having a high Pt content was formed above the first silicide layer formed under the first formation conditions. In this case, the pressure in the vacuum chamber at the first and second silicidation was 3.33×10$^2$ Pa (2.5 Torr), and the amount of the raw material gas supplied was 20 sccm. Thus, the pressure in the vacuum chamber and the amount of the raw material gas supplied were the same for the first and second silicidation. The supply periods of the raw material gas at the first and second silicidation were set at 45 minutes and 10 minutes, respectively.

Moreover, a first silicide layer was formed under first formation conditions (first silicidation), and a second silicide layer was continuously formed under second formation conditions in which the pressure in the vacuum chamber was lower than that in the first formation conditions (second silicidation). It was confirmed that the second silicide layer having a high Pt content was formed above the first silicide layer formed under the first formation conditions. In this case, the substrate temperature at the first and second silicidation was 300° C., and the amount of the raw material gas supplied was 20 sccm. Thus, the substrate temperature and the amount of the raw material gas supplied were the same for the first and second silicidation. The supply periods of the raw material gas at the first and second silicidation were set at 45 minutes and 10 minutes, respectively.

Example 16

In this example, conditions were set to be the same as in Example 1 except that Co(PF$_3$)$_6$ was used as a raw material gas to form a silicide layer. The raw material gas of Co(PF$_3$)$_6$ can be pyrolyzed at a temperature of 360° C. When the same evaluation as in Example 1 was performed for this example, it was confirmed that a silicide layer was formed on silicon under conditions in which no Co metal layer was deposited on the silicon.

Reference Example 4

When the amount of the raw material supplied, the substrate temperature, and the pressure in the vacuum chamber were changed in Example 16, it was confirmed that silicide layers having composition or crystal phases of CoSi$_2$, CoSi, and CoSi$_3$ could be formed by variation of those conditions. Furthermore, it was confirmed that a silicide layer having a composition or crystal phase of CoSi could be formed on CoSi$_2$ by optimizing formation profiles of a silicide layer as with Example 1.

Example 17

In this example, conditions were set to be the same as in Example 1 except that W(PF$_3$)$_6$, Ru(PF$_3$)$_5$, Ni(BF$_2$)$_4$, Pt(BF$_2$)$_4$, W(BF$_2$)$_6$, Ru(BF$_2$)$_5$, and Co(BF$_2$)$_6$ were respectively used as a raw material gas to form a silicide layer. Those raw material gases can be pyrolyzed at a temperature of 360° C. When the same evaluation as in Example 1 was performed for this example, it was confirmed that a silicide layer could be formed on silicon under conditions in which no metal layer of W, Ru, Ni, Pt, or Co was deposited on the silicon.

Furthermore, it was confirmed that a multilayer structure in which the metal content was increased at an upper portion could be formed by optimizing formation profiles of a silicide layer as with Example 1.

Reference Example 5

In this example, conditions were set to be the same as in Example 3 except that CpAllylPt (cyclopentadienylallylplatinum) including C was used as a raw material gas. FIGS. 19A and 19B show a cross-sectional measurement result of a silicide layer formed in this example, which was taken by SEM, and a composition analysis result by XPS. A silicon substrate was used as a substrate to be processed.

It can be seen from FIGS. 19A and 19B that a silicide layer was only formed locally and that a Pt metal layer was formed on the substrate. It can be seen from the composition analysis by XPS that the Pt metal layer contains a large amount of C. Thus, it can be seen that C forming the raw material gas was adsorbed on a surface of the substrate so as to inhibit silicidation. Accordingly, it is preferable that the raw material gas should not include a constituent element of C.

As described above, in a formation method of a metallic compound layer according to the present invention, a metallic compound layer can be formed by a one-stage process without an annealing process after deposition of a metallic film at a region on which the metallic compound layer is to be formed (e.g., a polysilicon region or the like).

Furthermore, according to the present invention, when a silicide layer is formed as a metallic compound layer, it is possible to reduce a formation temperature for a silicide layer having a Si-rich composition or crystal phase. Accordingly, an excessive no-load is prevented from being applied to a component portion of an element such as a silicide layer in a source/drain region.

Additionally, according to the present invention, a metallic compound layer having a desired composition can be formed while the composition or crystal phase and a formation rate of the metallic compound layer are not affected by the type and concentration of impurities in the substrate. A uniform metallic compound layer can be formed on a large area without damage to elements during a raw material decomposition process or damage caused to the substrate by the raw material gas. Furthermore, the present invention is suitable to form a metallic compound layer in a three-dimensional structure having good covering capability or wrapping capability or in a trench structure having a high aspect ratio.

Moreover, a formation apparatus of a metallic compound layer according to the present invention can inhibit decomposition of a raw material in a raw material supply system. Accordingly, it is possible to improve the controllability of formation of a metallic compound layer and the maintainability of the apparatus.

Industrial Applicability

A formation method of a metallic compound layer and a manufacturing method and apparatus of a semiconductor device according to the present invention is applicable to manufacture of electrodes in semiconductor devices or the like, barrier layers, cap layers, and the like.

The invention claimed is:

1. A method of forming a metallic compound layer, said method comprising:
preparing, in a chamber, a substrate having a surface on which a semiconductor material including one of germanium and silicon germanium is exposed; and
forming of the metallic compound layer, including:
supplying a raw material gas comprising a metal for forming a metallic compound with the semiconductor material exposed on the surface of the substrate to the chamber;
heating the substrate to a temperature at which the raw material gas is pyrolyzed; and
forming the metallic compound layer by a reaction of the metal of the raw material gas decomposed on the surface of the substrate with the semiconductor material under a condition in which no layer of the metal is deposited on the substrate.

2. The method as recited in claim 1, wherein the forming of the metallic compound layer includes:
forming a first metallic compound layer, and
forming a second metallic compound layer on the first metallic compound layer by supplying the raw material gas so that a first supply rate of the raw material gas is higher than a second supply rate of the raw material gas in the forming of the first metallic compound layer.

3. The method as recited in claim 1, wherein the forming of the metallic compound layer includes:
forming a first metallic compound layer; and
forming a second metallic compound layer on the first metallic compound layer by lowering a temperature of the substrate as compared to a temperature of the substrate in the forming of the first metallic compound layer.

4. The method as recited in claim 1, wherein the forming of the metallic compound layer includes:
forming a first metallic compound layer; and
forming a second metallic compound layer on the first metallic compound layer by lowering a first pressure in the chamber as compared to a second pressure in the chamber in the forming of the first metallic compound layer.

5. The method as recited in claim 1, wherein the forming of the metallic compound layer includes:
forming a first metallic compound layer; and
forming a second metallic compound layer on the first metallic compound layer by increasing a first metal content in the raw material gas as compared to a second metal content in raw material gas in the forming of the first metallic compound layer.

6. The method as recited in claim 1, wherein, in the forming of the metallic compound layer, the raw material gas comprises $Ni(PF_3)_4$ or $Ni(BF_2)_4$, and the substrate is heated to a temperature of 150° C. to 600° C. at which the raw material gas is pyrolyzed.

7. The method as recited in claim 1, wherein, in the forming of the metallic compound layer, the raw material gas comprises $Ni(PF_3)_4$ or $Ni(BF_2)_4$, and a pressure in the chamber is not more than $1.33 \times 10^4$ Pa (100 Torr).

8. The method as recited in claim 1, wherein, in the forming of the metallic compound layer, the raw material gas comprises $Ni(PF_3)_4$ or $Ni(BF_2)_4$, and a pressure in the chamber is not more than $1.33 \times 10^3$ Pa (10 Torr).

9. The method as recited in claim 1, wherein the metal comprises at least one of metal selected from the group consisting of Ni, Pt, Co, W, and Ru.

10. The method as recited in claim 1, wherein the raw material gas contains no C.

11. The method as recited in claim 1, wherein the raw material gas includes at least one of gas selected from the group consisting of $Ni(PF_3)_4$, $Ni(BF_2)_4$, $Pt(PF_3)_4$, $Pt(BF_2)_4$, $Co(PF_3)_6$, $Co(BF_2)_6$, $W(PF_3)_6$, $W(BF_2)_6$, $Ru(PF_3)_5$, and $Ru(BF_2)_5$.

12. The method as recited in claim 1, wherein, in the forming of the metallic compound layer, the raw material gas comprises $Ni(PF_3)_4$ or $Ni(BF_2)_4$, and a silicide layer having an $NiSi_2$ crystal phase is formed as the metallic compound layer.

13. The method as recited in claim 1, wherein, in the forming of the metallic compound layer, the raw material gas comprises $Ni(PF_3)_4$ or $Ni(BF_2)_4$, the substrate is heated to a temperature of 150° C. to 600° C. at which the raw material gas is pyrolyzed, and a silicide layer having an $NiSi_2$ crystal phase is formed as the metallic compound layer.

14. The method as recited in claim 1, wherein, in the forming of the metallic compound layer, the raw material gas comprises $Ni(PF_3)_4$ or $Ni(BF_2)_4$, a pressure in, the chamber is in a range of $1.33 \times 10^{-2}$ Pa ($1 \times 10^{-4}$ Torr) to $1.33 \times 10^4$ Pa (100 Torr), and a silicide layer having an $NiSi_2$ crystal phase is formed as the metallic compound layer.

15. The method as recited in claim 1, wherein, in the forming of the metallic compound layer, the raw material gas comprises $Ni(PF_3)_4$ or $Ni(BF_2)_4$, and a silicide layer having an NiSi crystal phase is formed as the metallic compound layer.

16. The method as recited in claim 1, wherein, in the forming of the metallic compound layer, the raw material gas comprises $Ni(PF_3)_4$ or $Ni(BF_2)_4$, the substrate is heated to a temperature of 250° C. to 600° C. at which the raw material gas is pyrolyzed, and a silicide layer having an NiSi crystal phase is formed as the metallic compound layer.

17. The method as recited in claim 1, wherein, in the forming of the metallic compound layer, the raw material gas comprises $Ni(PF_3)_4$ or $Ni(BF_2)_4$, a pressure in the chamber is in a range of $1.33 \times 10^{-2}$ Pa ($1 \times 10^{-4}$ Torr) to $1.06 \times 10^4$ Pa (80 Torr), and a silicide layer having an NiSi crystal phase is formed as the metallic compound layer.

18. The method as recited in claim 1, wherein, in the forming of the metallic compound layer, the raw material gas comprises $Ni(PF_3)_4$ or $Ni(BF_2)_4$, and a silicide layer having an $Ni_3Si$ crystal phase is formed as the metallic compound layer.

19. The method as recited in claim 1, wherein, in the forming of the metallic compound layer, the raw material gas comprises $Ni(PF_3)_4$ or $Ni(BF_2)_4$, the substrate is heated to a temperature of 250° C. to 500° C. at which the raw material gas is pyrolyzed, and a silicide layer having an $Ni_3Si$ crystal phase is formed as the metallic compound layer.

20. The method as recited in claim 1, wherein, in the forming of the metallic compound layer, the raw material gas comprises $Ni(PF_3)_4$ or $Ni(BF_2)_4$, a pressure in the chamber is in a range of $1.33 \times 10^{-2}$ Pa ($1 \times 10^{-4}$ Torr) to $1.33 \times 10^3$ Pa (10 Torr), and a silicide layer having an $Ni_3Si$ crystal phase is formed as the metallic compound layer.

21. The method as recited in claim 1, wherein the raw material gas comprises $Ni(PF_3)_4$ or $Ni(BF_2)_4$, and the forming of the metallic compound layer includes:
forming a first silicide layer having an $NiSi_2$ crystal phase; and
forming a second silicide layer having a crystal phase of at least one of an NiSi crystal phase and an $Ni_3Si$ crystal phase on the first silicide layer.

22. The method as recited in claim 1, wherein, in the forming of the metallic compound layer, the raw material, gas comprises $Co(PF_3)_6$ or $Co(BF_2)_6$, and a silicide layer having a $CoSi_2$ crystal phase is formed as the metallic compound layer.

23. The method as recited in claim 1, wherein, in the forming of the metallic compound layer, the raw material gas comprises $Co(PF_3)_6$ or $Co(BF_2)_6$, and a silicide layer having a CoSi crystal phase is formed as the metallic compound layer.

24. The method as recited in claim 1, wherein, in the forming of the metallic compound layer, the raw material gas comprises $Co(PF_3)_6$ or $Co(BF_2)_6$, and
a silicide layer having a $Co_3Si$ crystal phase is formed as the metallic compound layer.

25. The method as recited in claim 1, wherein the raw material gas comprises $Co(PF_3)_6$ or $Co(BF_2)_6$, and the forming of the metallic compound layer includes:
forming a first silicide layer having a $CoSi_2$ crystal phase; and
forming a second silicide layer having a $Co_3Si$ crystal phase on the first silicide layer.

26. The method as recited in claim 1, wherein the metal of the raw material gas reacts with the semiconductor material after the raw material gas is pyrolyzed on the surface of the substrate.

27. The method as recited in claim 1, wherein an ambient temperature of the chamber is set at a temperature at which the raw material gas is prevented from being pyrolyzed.

28. A method of manufacturing a semiconductor device, said method comprising:
preparing a substrate having a surface on which a semiconductor material including one of germanium and silicon germanium is exposed;
forming a gate insulation film and a gate pattern on the substrate;
forming a source/drain region on both sides of the gate pattern to sandwich the gate pattern;
forming a metallic compound layer on the source/drain region by a reaction of a first metal of a first raw material gas decomposed on the surface of the substrate with the semiconductor material so that no layer of the first metal is deposited on the substrate, by supplying the first raw material gas comprising the first metal for forming a metallic compound with germanium or silicon germanium, and thereafter by heating the substrate to a temperature at which the first raw material gas is pyrolyzed; and
forming the gate pattern into a gate electrode.

29. The method of a semiconductor device as recited in claim 28, wherein the forming of the gate insulation film and the gate pattern on the substrate, includes forming the gate pattern of the semiconductor material, the forming of the gate electrode includes:
supplying a second raw material gas containing a second metal for forming a metallic compound with the semiconductor material;
heating the substrate to a temperature at which the second raw material gas is pyrolyzed; and
forming the gate pattern into a gate electrode including a metallic compound by reaction of the second metal gas with the semiconductor material so that no layer of the second later is deposited on the gate pattern.

30. An apparatus for forming a metallic compound layer, said apparatus comprising:
a chamber;
a substrate holder provided in the chamber to hold a substrate that comprises a surface on which one of germanium and silicon germanium is exposed;
a first heater for increasing a temperature of the substrate holder;
a raw material gas supply portion connected to the chamber through a raw material gas inlet to supply a raw material gas;
a second heater operable to increase a temperature of the raw material gas inlet;
a conductance valve for adjusting a pressure in the chamber; and
a controller for adjusting a temperature of the substrate holder, a temperature of the raw material gas inlet, an amount of the raw material gas supplied, and a pressure in the chamber to prevent a layer of a metal contained in the raw material gas from being deposited on the substrate held in the chamber.

31. The apparatus as recited in claim 30, wherein said controller prevents the raw material gas from being pyrolyzed prior to being disposed on a surface of the substrate.

* * * * *